United States Patent
Potrepka et al.

(10) Patent No.: US 10,266,936 B2
(45) Date of Patent: Apr. 23, 2019

(54) PROCESS FOR MAKING LEAD ZIRCONATE TITANATE (PZT) LAYERS AND/OR PLATINUM ELECTRODES AND PRODUCTS THEREOF

(71) Applicant: U.S. Army Research Laboratory, Washington, DC (US)

(72) Inventors: Daniel M. Potrepka, Silver Spring, MD (US); James R. Mulcahy, Bowie, MD (US); Ronald G. Polcawich, Derwood, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 114 days.

(21) Appl. No.: 15/061,205

(22) Filed: Mar. 4, 2016

(65) Prior Publication Data
US 2016/0254439 A1 Sep. 1, 2016

Related U.S. Application Data

(63) Continuation-in-part of application No. 14/219,028, filed on Mar. 19, 2014, now Pat. No. 9,761,785.
(Continued)

(51) Int. Cl.
*C23C 14/08* (2006.01)
*C23C 14/18* (2006.01)
(Continued)

(52) U.S. Cl.
CPC .......... *C23C 14/088* (2013.01); *C23C 14/185* (2013.01); *C23C 14/5853* (2013.01);
(Continued)

(58) Field of Classification Search
CPC . C23C 14/088; C23C 14/185; C23C 14/5853; C30B 1/02; C30B 1/10;
(Continued)

(56) References Cited

U.S. PATENT DOCUMENTS 5,293,075 A  3/1994  Onishi et al.
6,287,986 B1  9/2001  Mihara
(Continued)

FOREIGN PATENT DOCUMENTS

WO  WO2014075759 A1  5/2014

OTHER PUBLICATIONS

Chapter 5 Sputtering tools, Ronald A. Powell, Stephen M. Rossnagel, Thin Films, Elsevier, vol. 26, 1999, pp. 103-183, ISSN 1079-4050, ISBN 9780125330268, (Year: 1999).*
(Continued)

*Primary Examiner* — Michael A Band
(74) *Attorney, Agent, or Firm* — Lawrence E. Anderson; Christos S. Kyriakou

(57) ABSTRACT

A method of making a piezoelectric device comprising providing a deposition chamber, the deposition chamber having reduced pressure therein; loading a substrate into the deposition chamber; sputter depositing hexagonal 001 oriented titanium on the substrate; providing an oxygen anneal to convert 001 oriented titanium into 100 oriented rutile $TiO_2$; sputter depositing a 111 or 100 oriented textured conducting material for use as an electrode; sputter depositing a hexagonal 001 oriented titanium and providing an oxygen anneal in a lead oxide environment to convert 001 oriented titanium into 100 oriented rutile $TiO_2$ or $Pb_xTi_{1-x}O_3$; sputter depositing textured lead zirconate titanate $Pb Zr_xTi_{1-x}O_3$ having an 001 orientation as a piezoelectric layer, and sputter depositing a textured electrode on top of the textured lead zirconate titanate; whereby processing of the layers within the deposition chamber provides minimized exposure to ambient contamination and improved texturing in the resulting films.

22 Claims, 29 Drawing Sheets

– Growth of {111}-stylo-epitaxy

| | |
|---|---|
| 18C– {111}-textured Electrode (10-300 nm) | {111}-textured Pt (100 nm) —18 |
| 17C–{001}-textured Perovskite ferroelectric | {001}-textured PZT —17 |
| 15C– {001}-textured Perovskite Seed | {001}-textured $PbTiO_3$ —15' |
| 14C– {111}-textured Electrode (10-300 nm) | {111}-textured Pt (100 nm) —14 |
| 13C– Texture Oxide or Nitride (1 - 200 nm) | {100}-texture $TiO_2$ (30 - 50 nm)  13 |
| Amorphous Oxide or Nitride  12C | $SiO_2$  12 |
| Substrate  11C | Si  11 |

Relative to FIG. 3A, the embodiments shown in FIG. 24 do not show a PZT seed layer 16 and do show a $PbTiO_3$ layer 15' instead a $TiO_3$ layer 15 in FIG. 3A

Related U.S. Application Data which is a continuation-in-part of application No. 13/436,349, filed on Mar. 30, 2012, now abandoned.

(60) Provisional application No. 61/547,990, filed on Oct. 17, 2011, provisional application No. 61/547,879, filed on Oct. 17, 2011.

(51) Int. Cl.

| | |
|---|---|
| *C23C 14/58* | (2006.01) |
| *H01L 41/08* | (2006.01) |
| *H01L 41/187* | (2006.01) |
| *H01L 41/316* | (2013.01) |
| *H01L 41/319* | (2013.01) |
| *H01L 41/27* | (2013.01) |
| *C30B 29/02* | (2006.01) |
| *C30B 29/16* | (2006.01) |
| *C30B 29/32* | (2006.01) |
| *C30B 29/68* | (2006.01) |
| *C30B 1/02* | (2006.01) |
| *C30B 1/10* | (2006.01) |
| *C30B 23/02* | (2006.01) |
| *C30B 25/18* | (2006.01) |

(52) U.S. Cl.
CPC ............... *C30B 1/02* (2013.01); *C30B 1/10* (2013.01); *C30B 23/025* (2013.01); *C30B 29/02* (2013.01); *C30B 29/16* (2013.01); *C30B 29/32* (2013.01); *C30B 29/68* (2013.01); *H01L 41/0815* (2013.01); *H01L 41/1876* (2013.01); *H01L 41/27* (2013.01); *H01L 41/316* (2013.01); *H01L 41/319* (2013.01); *C30B 25/183* (2013.01)

(58) Field of Classification Search
CPC ......... C30B 29/02; C30B 29/16; C30B 29/32; C30B 29/68; C30B 23/025
See application file for complete search history.

(56) References Cited

U.S. PATENT DOCUMENTS

| | | |
|---|---|---|
| 6,297,085 B1 | 10/2001 | Aoki et al. |
| 6,455,326 B1 | 9/2002 | Eastep |
| 6,682,772 B1 | 1/2004 | Fox et al. |
| 6,777,287 B2 | 8/2004 | Ozawa et al. |
| 6,887,716 B2 | 5/2005 | Fox et al. |
| 7,247,504 B2 | 7/2007 | Matsuura et al. |
| 7,291,308 B2 | 11/2007 | Wu |
| 7,291,530 B2 | 11/2007 | Nakagawa |
| 7,423,308 B2 | 9/2008 | Kurasawa |
| 7,956,369 B2 | 6/2011 | Reed et al. |
| 8,164,234 B2 | 4/2012 | Li et al. |
| 8,246,794 B2 | 8/2012 | Kadlee et al. |
| 8,574,409 B2 | 11/2013 | Kadlee et al. |
| 8,866,367 B2 | 10/2014 | Fox et al. |
| 9,761,785 B2 | 9/2017 | Fox et al. |
| 2004/0155559 A1 | 8/2004 | Ifuku |
| 2006/0285255 A1 | 12/2006 | Kawakubo et al. |
| 2010/0006780 A1 | 1/2010 | Metcalfe |
| 2010/0126853 A1 | 5/2010 | Kratzer |
| 2010/0133959 A1 | 6/2010 | Yamazaki |
| 2010/0206713 A1 | 8/2010 | Youming et al. |
| 2010/0231095 A1 | 9/2010 | Kubota |
| 2013/0093290 A1 | 4/2013 | Fox et al. |
| 2014/0265734 A1 | 9/2014 | Fox et al. |

OTHER PUBLICATIONS

Vaudin, Mark D. et al., "Accuracy and Reproducibility of X-ray Texture Measurements on Thin Films," Mat. Res. Soc. Symp. Proc., vol. 721, pp. J1.2.1-J1.2.6; entitled "Magnetic and Electronic Films-Microstructure, Texture and Application to Data Storage," edited by P.W. DeHaven et al. (Mat. Res. Soc., Warrendale PA, 2002) pp. 17-22.

Mai Pham-Thi, "Xray Investigation of High Oriented (1-x)PbMg1/3Nb2/3O3—(x)PbTiO3 Ceramics,"Journal of the European Ceramic Society 25 (2005) 2433-2435.

Garcia, R. Edwin, et al., "The Effect of Texture and Microstructure on the Macroscopic Properties of Polycrystalline Piezoelectrics: Application to Barium Titanate and PZN-PT,"J. Am. Ceram. Soc., 88 [3] 750-757 (2005) DOI: 10.1111/j.1551-2916.2005.00109.x.

Sanchez, L.M., et al., "Optimization of PbTiO3 Seed Layers and Pt Metallization for PZT-based PiezoMEMS Actuators,"J. Mater Res., vol. 28, No. 14, Jul. 28, 2013, pp. 1920-1931.

Maurya, K.K. et al., "High resolution X-ray and electron microscopy characterization of PZT thin films prepared by RF magnetron sputtering," Applied Surface Science vol. 313, pp. 196-206 (2014).

L.M. Sanchez, Luz, M. "Optimization of Pb(Zr0.52Ti0.48)O3 through improved platinum metallization, use of a PbTiO3 seed layer, and fine tuning of annealing conditions for applications in multilayer actuator MEMS technology," Ph.D. Thesis, U. Maryland, 2014.

Muralt, Paul, et al, "Texture Control of PbTiO3 and Pb(Zr,Ti)O3 Thin Films with TiO3 Seeding," Journal of Applied Physics, vol. 83, Issue 7, pp. 3835-3841 (1998).

Potrepka, et. al., "Pt/TiO2 Growth Templates for Enhanced PZT Films and MEMS Devices," MRS Proceedings Session S, (mrsf10-1299-s02-04),vol. 1299, (2010).

Oerlikon Clusterline 200 Sputtering System Instructions, Edition Dec. 2001 (Dec. 2001).

\* cited by examiner

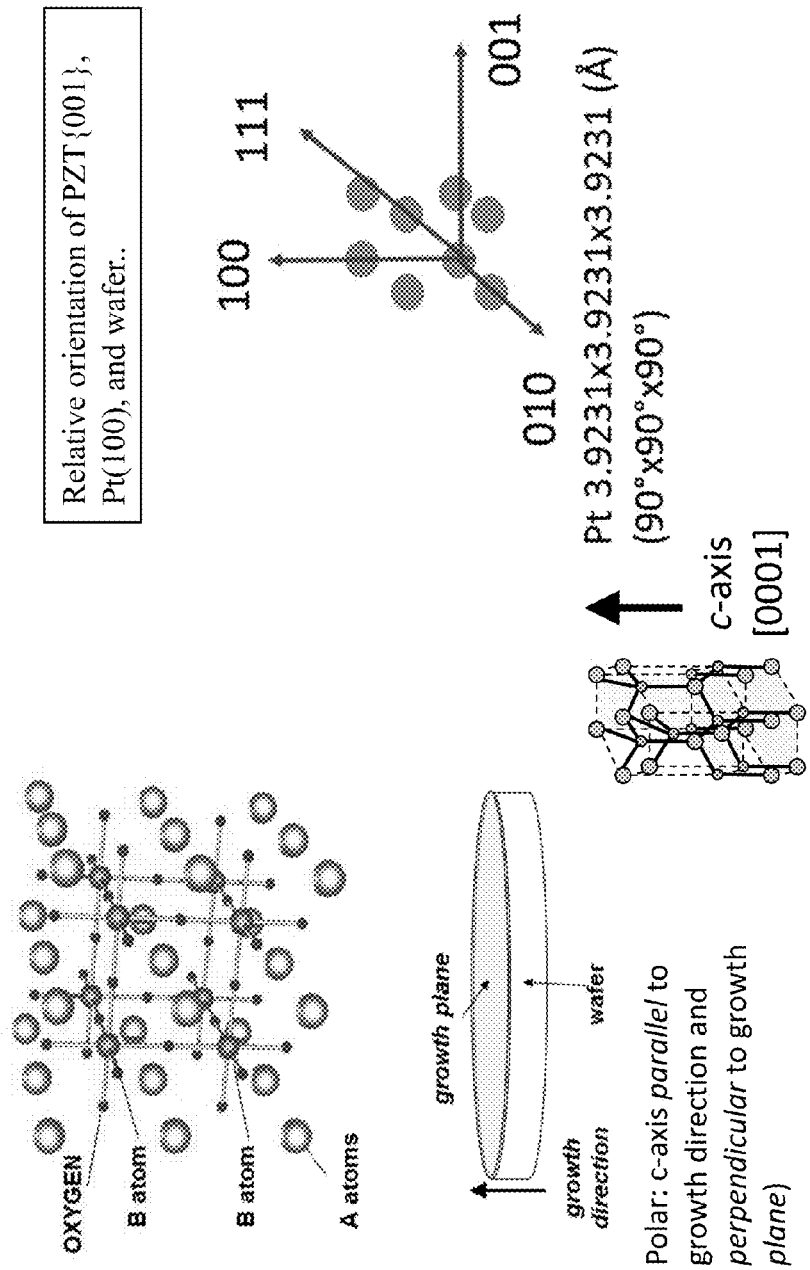
FIG. 2  Pt on oriented PZT: Drawings of the atomic configurations

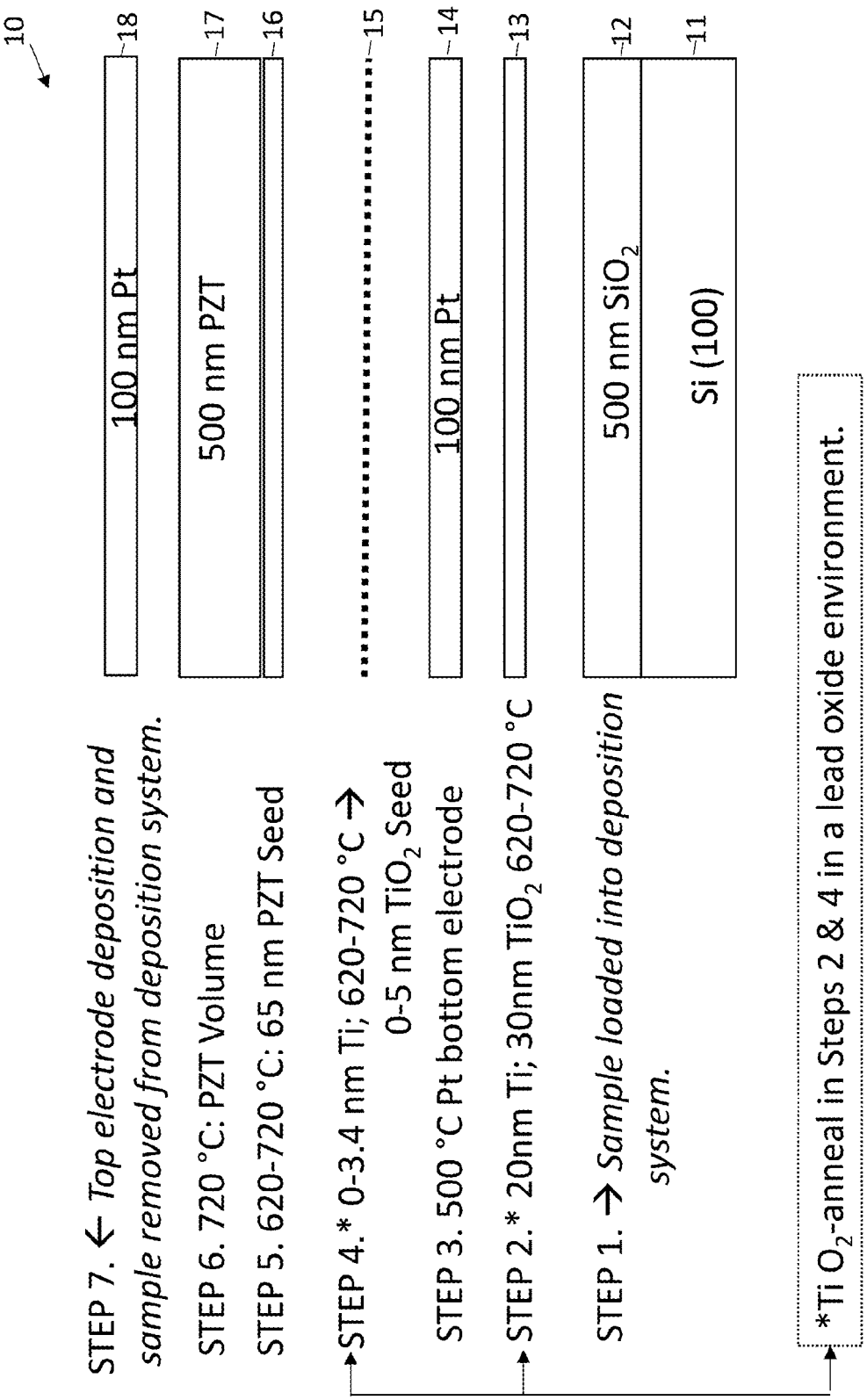
FIG. 3A Process Steps

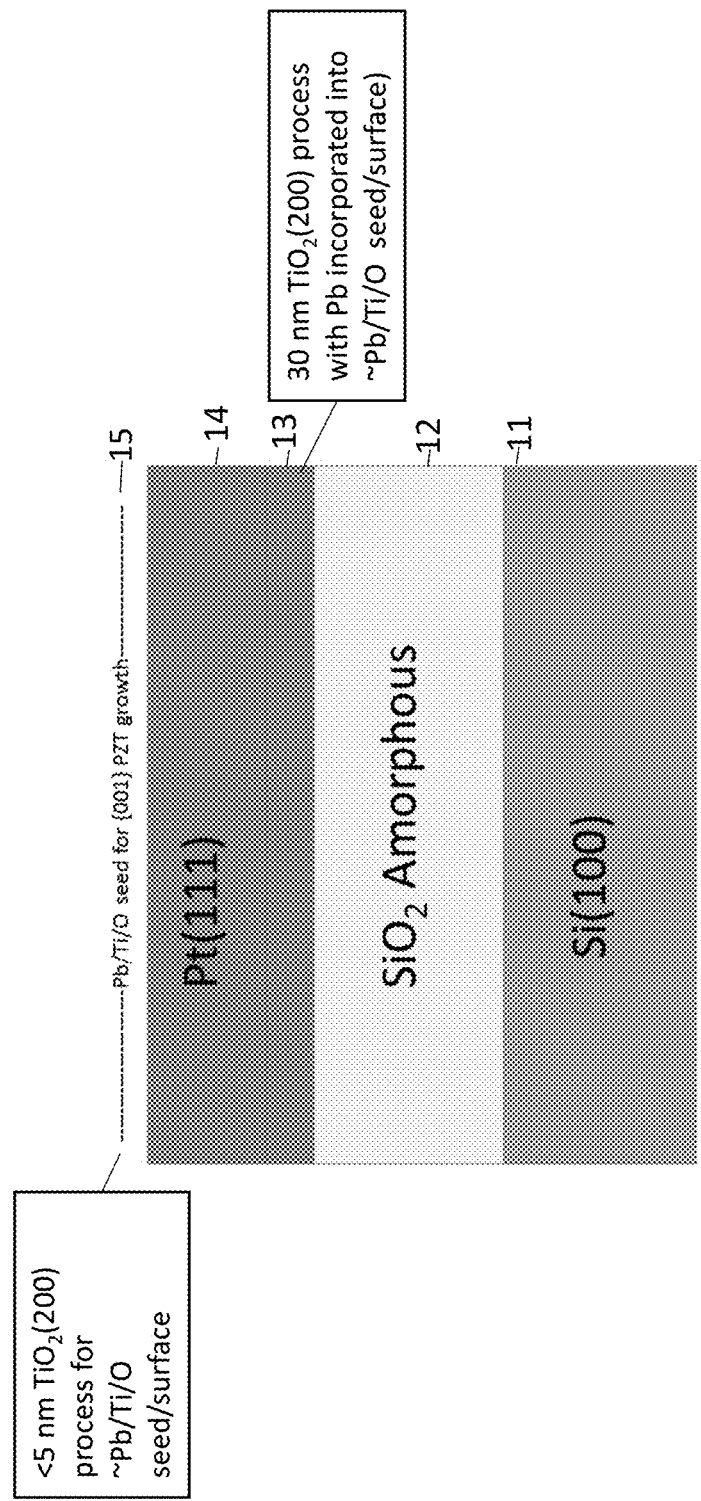
FIG. 3B  Ti seed becomes Pb + Ti + O compound when oxidized.

Preferred all-sputtered material approach for 001 PZT (similar to that by chemical solution deposition (CSD) seed layers of CSD PbTiO$_3$) using Ar, O$_2$, system vacuum, and the lead oxide vapor pressure in the PZT sputter chamber.

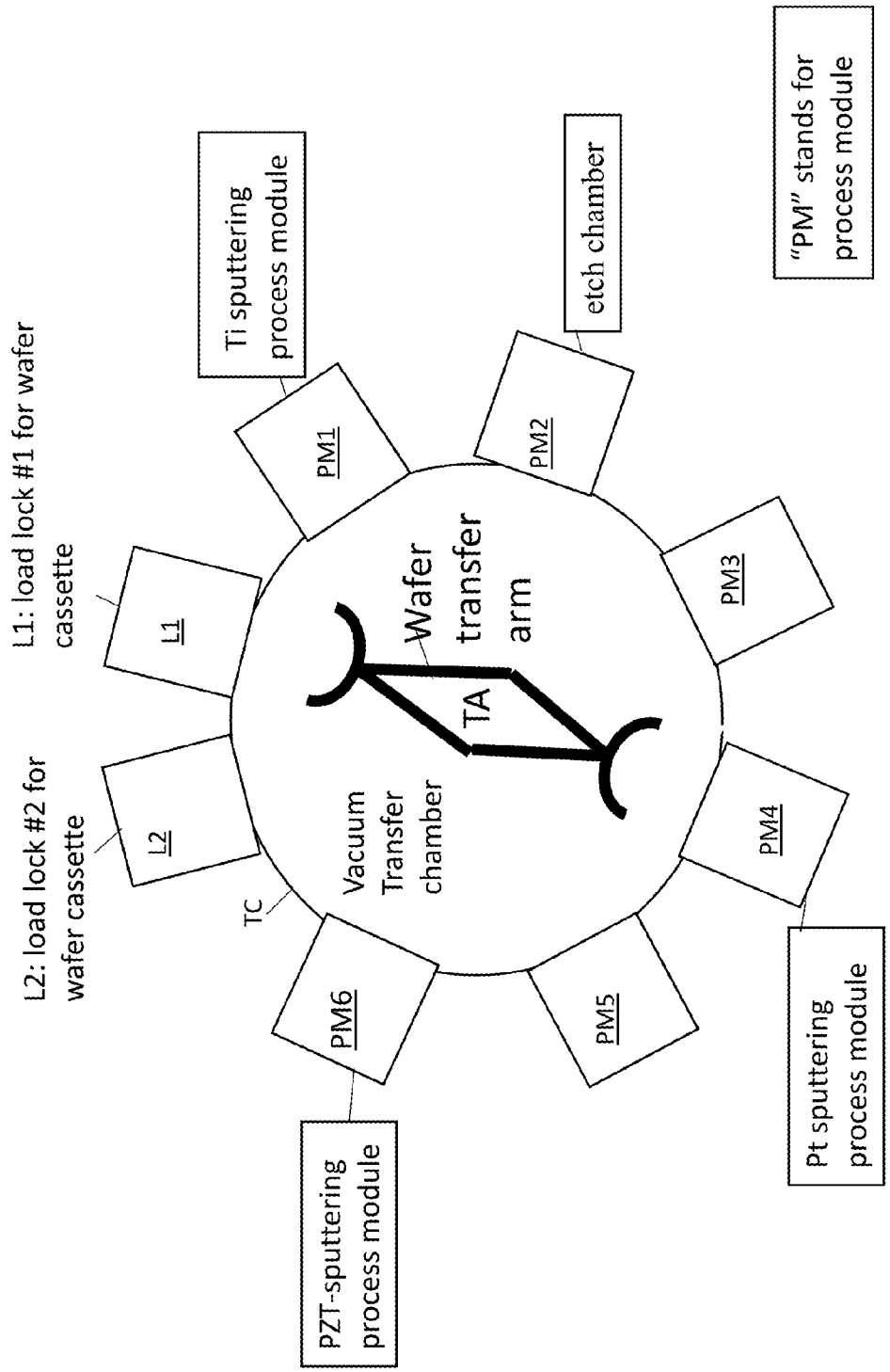
FIG. 4   Clusterline system with vacuum transfer chamber (center) for wafer load-unload into and out of wafer boats and chamber-to-chamber.

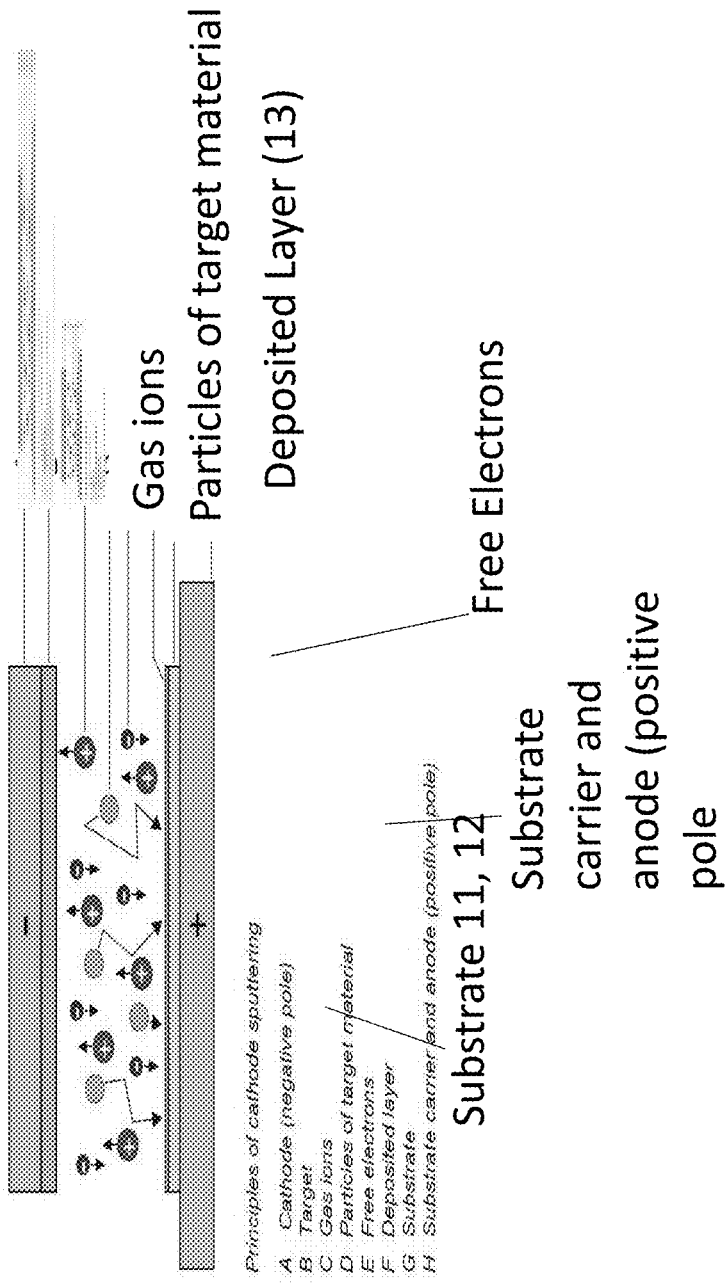
FIG. 5 Cathode sputtering.

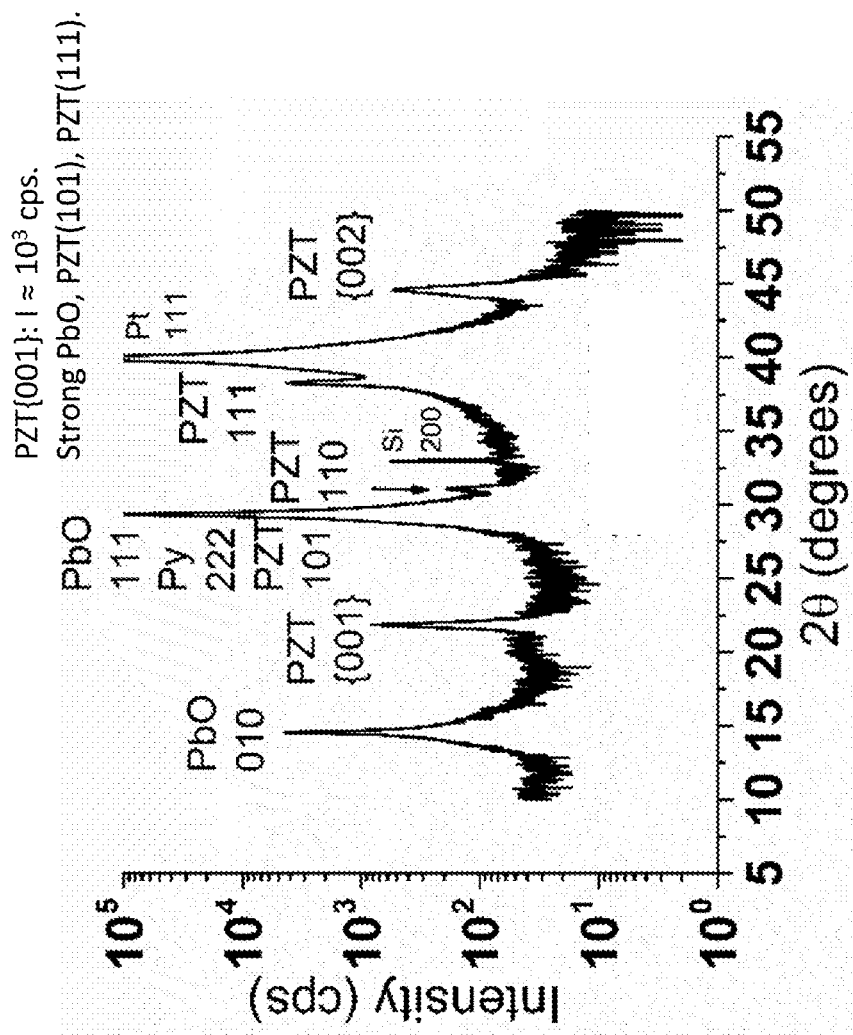
FIG. 6 Sputter PZT on Pt/TiO$_2$ (No seed layer)
20 nm Ti converted to 30 nm TiO$_2$ template for Pt by ex-situ O$_2$-anneal in tube furnace. Step 6 furnace anneal process of TiO$_2$ thin seed does not work; creates peaks that are undesirable Sputter PZT on Pt/TiO$_2$ (TiO$_2$ seed)

PZT: I{001} > 10$^5$ cps. I(111) = 0. Both I(101) & I(110) <500cps.

All in-situ process with 20 nm and 2 nm Ti converted to 30 nm TiO$_2$ Pt-template and 3nm TiO$_2$ seed, respectively, by 720 °C O$_2$-anneal in a lead oxide environment.

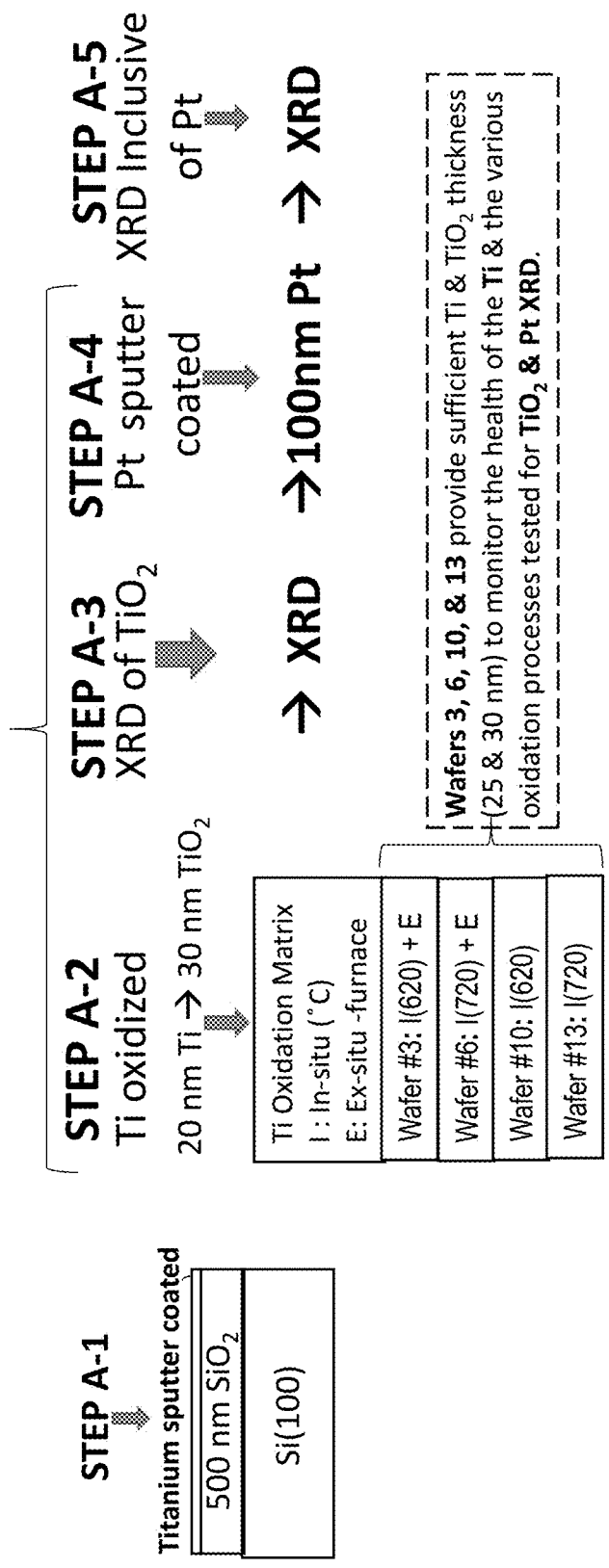
FIG. 10 Sputtered-Ti: TiO₂ & Pt XRD

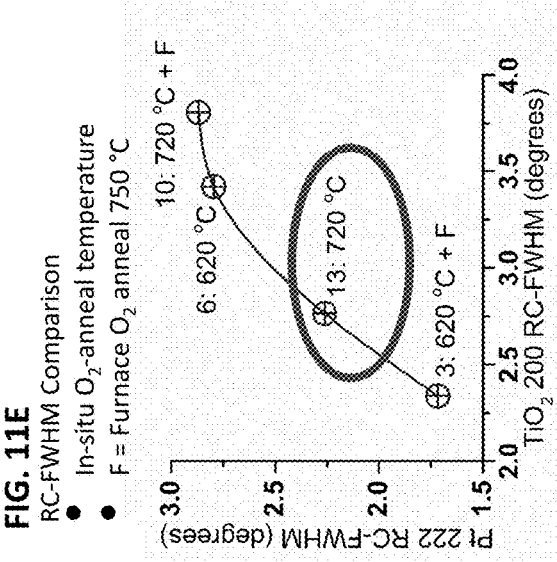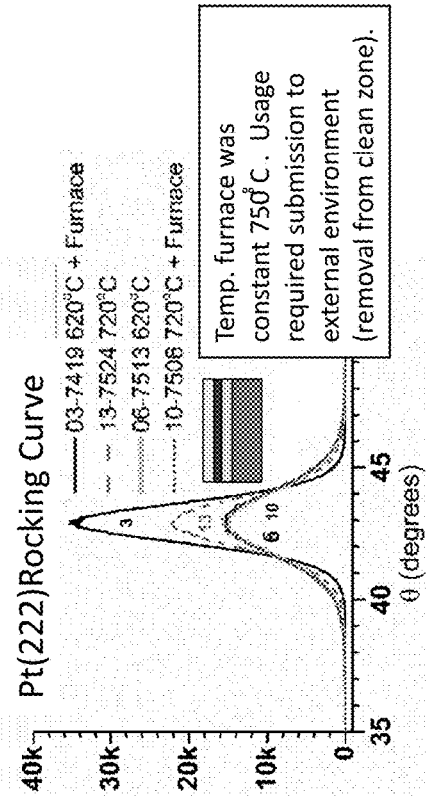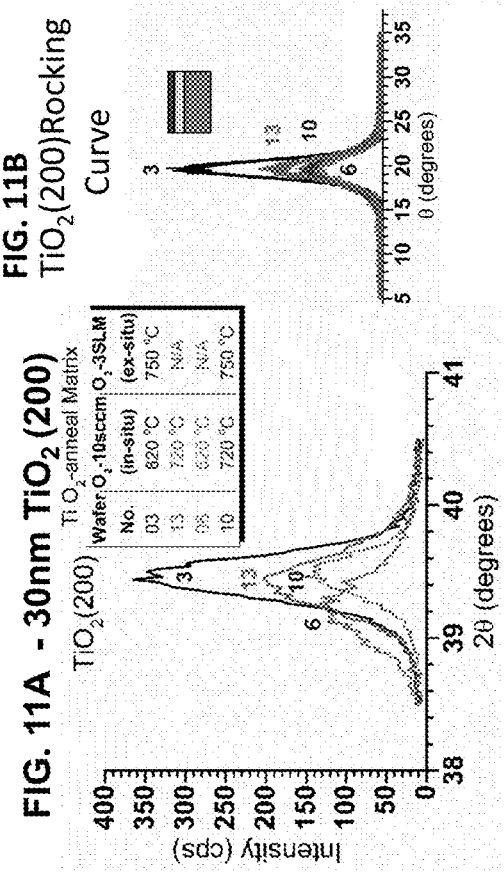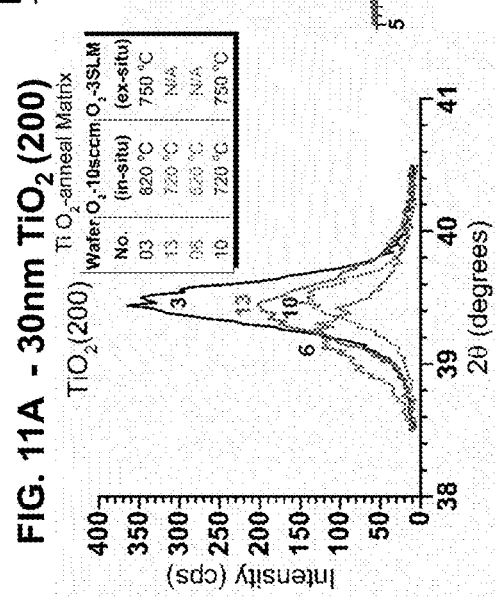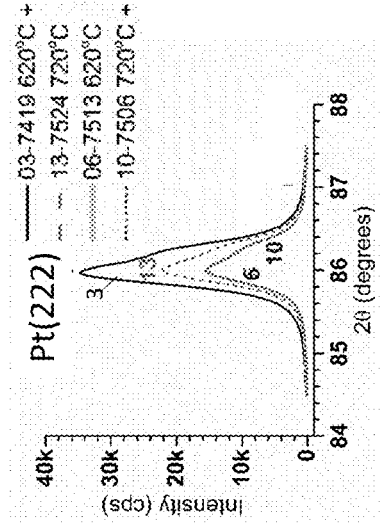
A-E Oxidation & TiO₂-Pt Correlation
FIG. 11A - 30nm TiO₂(200)
FIG. 11B TiO₂(200) Rocking Curve
FIG. 11C 100nm-Pt/30nm-TiO₂
FIG. 11D Pt(222) Rocking Curve
FIG. 11E RC-FWHM Comparison

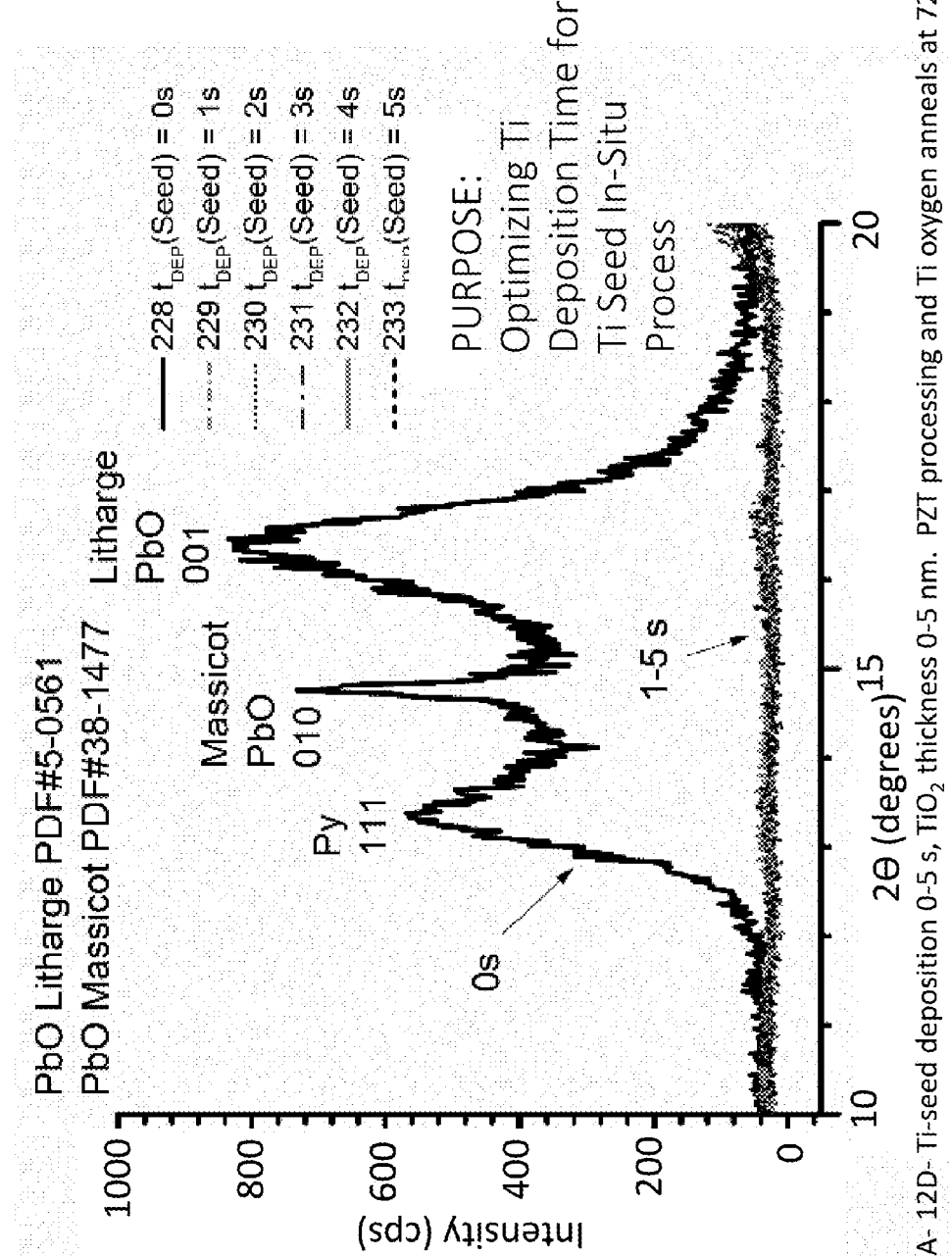
FIG. 12A X-RAY DIFFRACTION
FOR FIGS. 12A-12D- Ti-seed deposition 0-5 s, TiO₂ thickness 0-5 nm. PZT processing and Ti oxygen anneals at 720 °C.

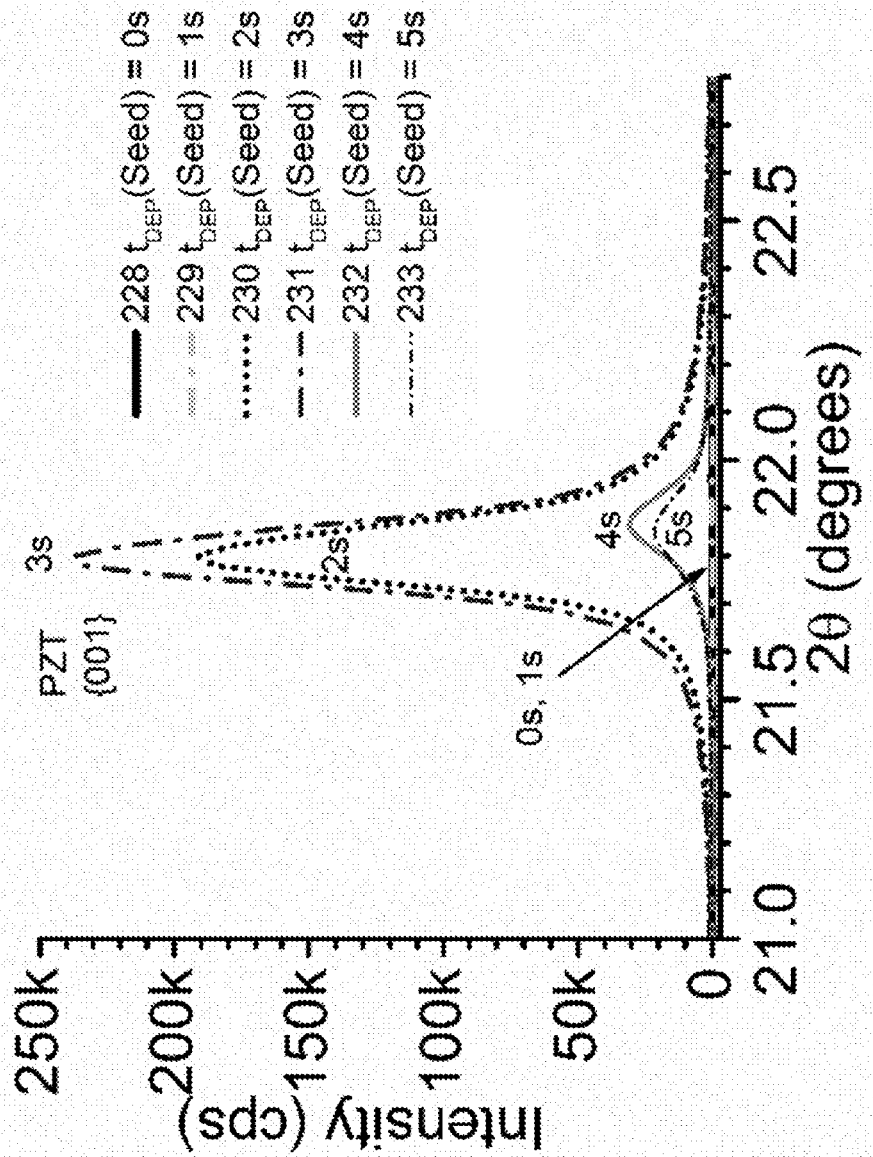
FIG. 12B X-RAY DIFFRACTION

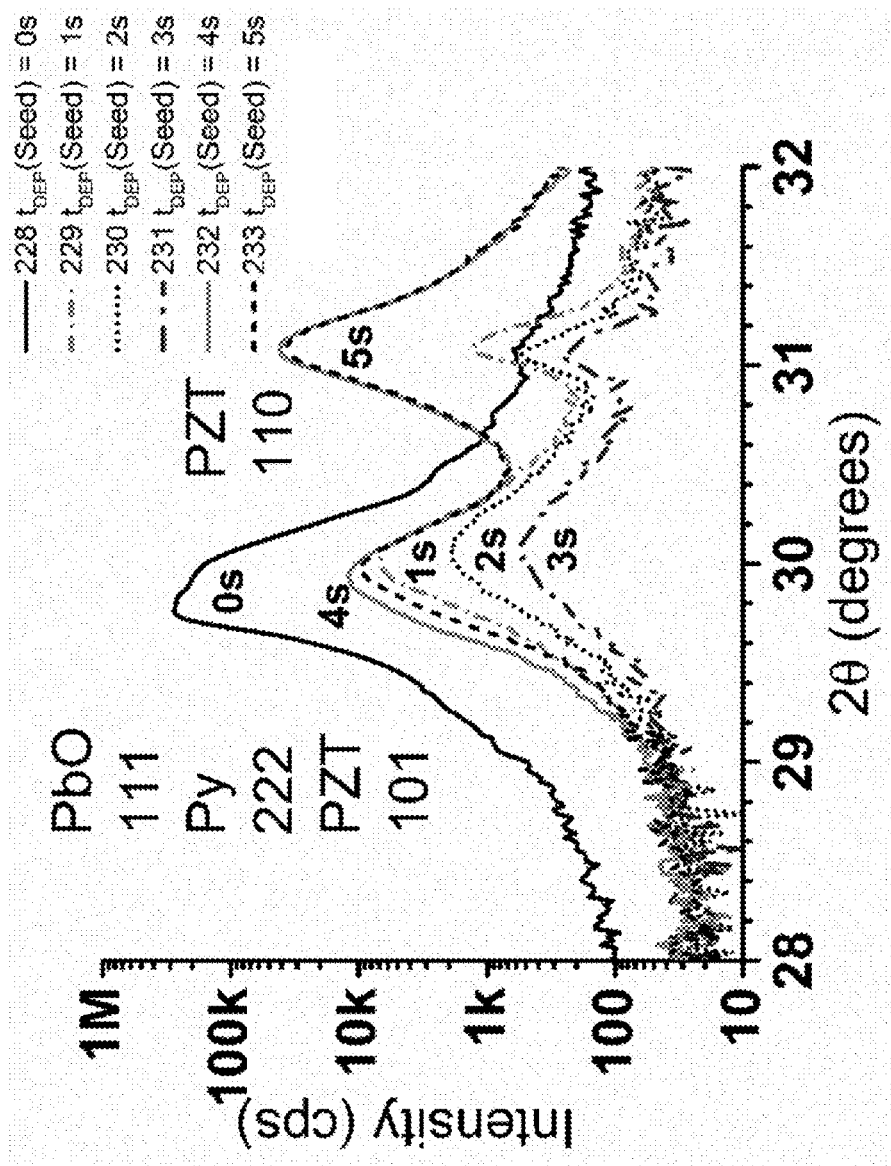
FIG. 12C X-RAY DIFFRACTION

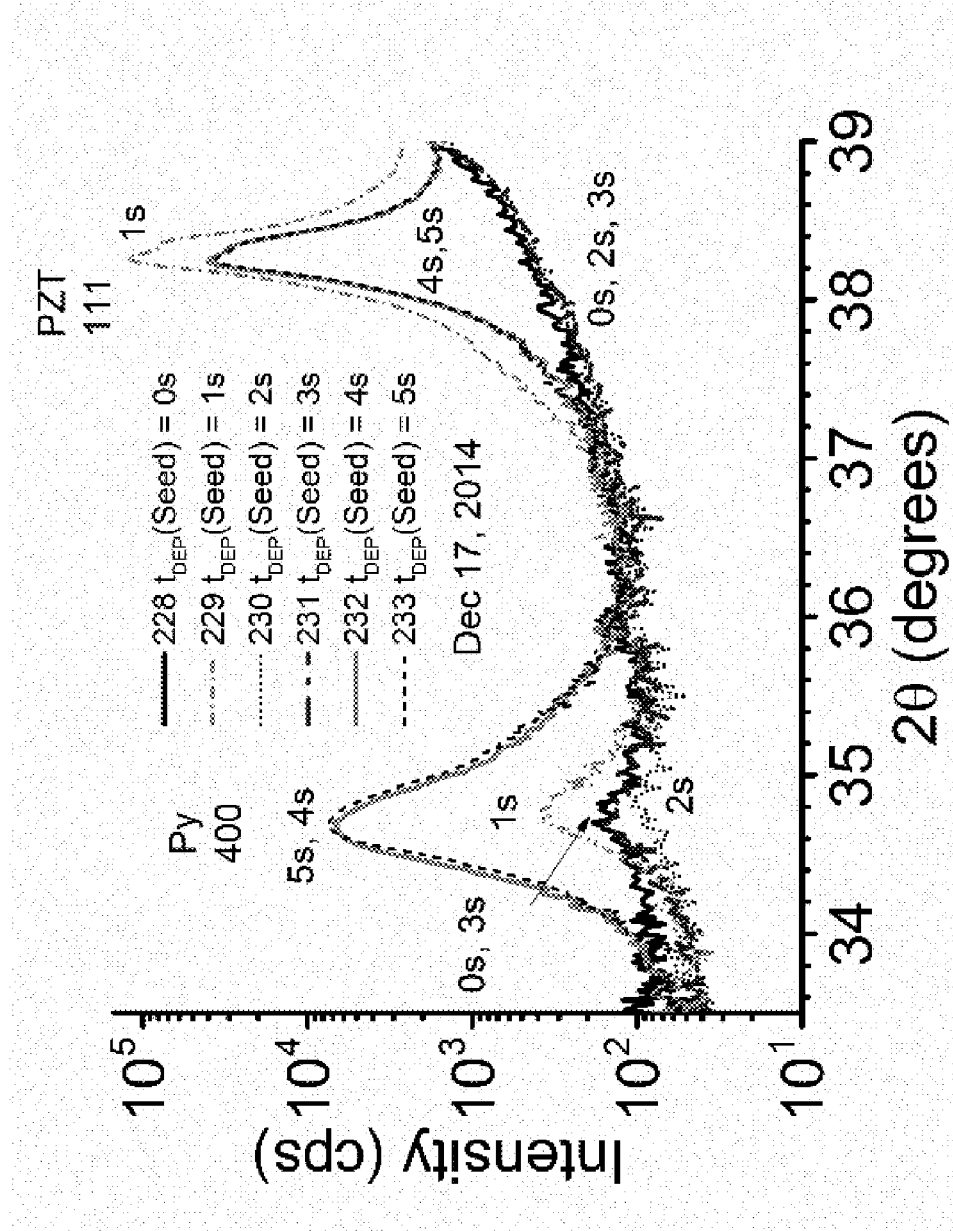
FIG. 12D X-RAY DIFFRACTION

FIG. 16 - Pt & IrO$_2$ Top Electrodes

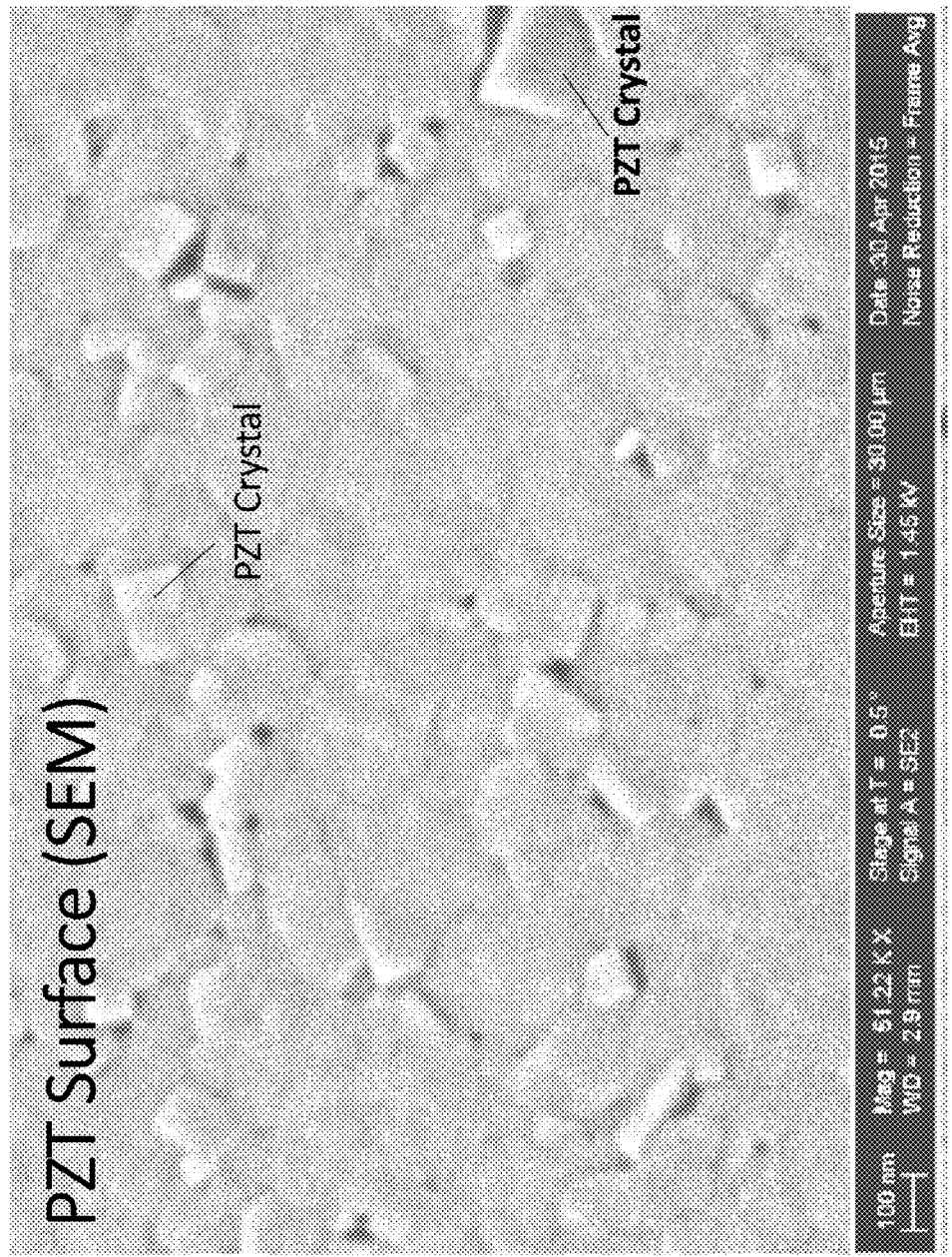
FIG. 18  Scanning electron micrograph (or microscope image) SEM

Fig. 19 Electrical Data – PZT Capacitors (In-Situ Sputter Process)

| Wafer # | T (°C) | Substrate | Elastic Layer | PZT Thickness (nm) | Top Electrode | Lotgering Factor (001) Texture (%) |
|---|---|---|---|---|---|---|
| 236-7703 | 720 | Therm Ox | 0.5 μm | 450 | Pt | 95 |
| 237-6699 | 720 | Therm Ox | 0.5 μm | 450 | Pt | 95 |
| 238-6719 | 720 | Therm Ox | 0.5 μm | 450 | IrO$_2$ | 95 |
| 239-6722 | 720 | Therm Ox | 0.5 μm | 450 | IrO$_2$ | 95 |
| Typical CSD* | 750 | Therm Ox | 0.5 μm | 500 | Pt | 95-99 |

Lotgering Factor for CSD is f(001)≈0.98-0.99 for the CSD PZT

| Wafer # | t$_{PZT}$ (μm) | Loc'n | P$_{max}$ (μC/cm$^2$) | Prem | Leakage (nA) | ε33 | tan δ |
|---|---|---|---|---|---|---|---|
| 236-7703Pt | 0.45 | R | 27.4 | -1.9/1.3 | 10 | 554 | 0.015 |
| 237-6699Pt | 0.45 | R | 25 | -1.5/2 | 10 | 499 | 0.016 |
| 238-6719IrO$_2$ | 0.45 | R | 39.7 | -8/8 | 10 | 862 | 0.016 |
| 239-6722IrO$_2$ | 0.45 | R | 38.3 | -6.2/7.4 | 10 | 786 | 0.014 |
| Typical CSD* | 0.55 | -- | 40 | similar | 20 | 1400 | 0.06 |

*Using top IrOx electrode, e33 is about half that of CSD with top Pt.*   *L.M. Sanchez, PhD Thesis (2014).

FIG. 20  Multilayer PZT device with a sequence of Pt-PZT bi-layers

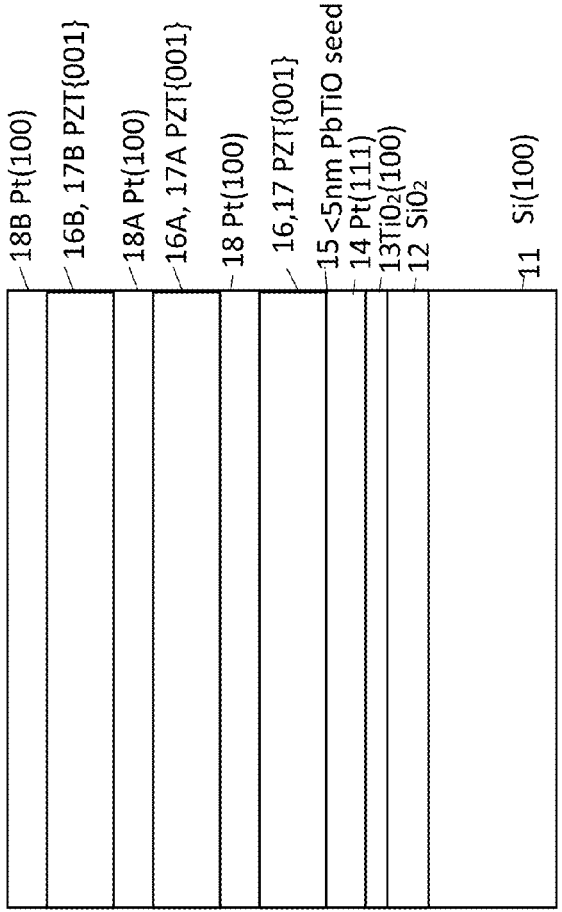

- 18B Pt(100)
- 16B, 17B PZT{001}
- 18A Pt(100)
- 16A, 17A PZT{001}
- 18 Pt(100)
- 16,17 PZT{001}
- 15 <5nm PbTiO seed
- 14 Pt(111)
- 13 TiO$_2$(100)
- 12 SiO$_2$
- 11 Si(100)

Three Pt(100) on PZT{001} bilayers on <5nm TiO$_2$ seed (oxidized in PM6), on Pt(111). Top Pt from the prior bi-layer acts as a growth template for (sputtered) PZT. 100 Pt electrode is superior to 111 oriented Pt. See Fig. 10 which shows Pt(111) along the body diagonal of the Pt cubic unit cell. PZT can grow on Pt(111) but requires PTO seed. PZT growth without PTO seed is possible on Pt(100). In addition, for Pt(100) growth on PZT{001}, the TiO$_2$(100) layer for Pt growth can be eliminated since the Pt grows directly on the PZT. PZT and Pt could each use the other as the growth template. See ARL 11-32 and US Patent 8,866,367 to which this discussion is related.

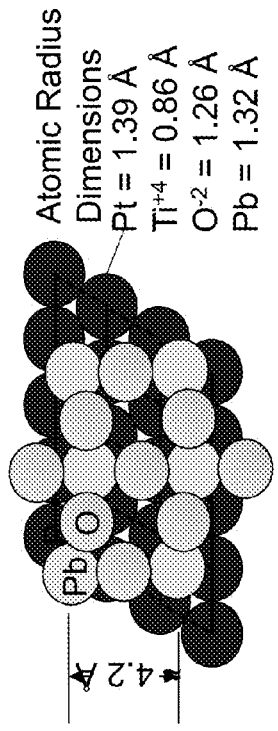

Fig. 21A Oxygenation Anneal
- 650 – 800°C, 15 or 30 min, 10 SLM O$_2$
- Rutile TiO2
- 150 – 430 Å ← 4.686 Å

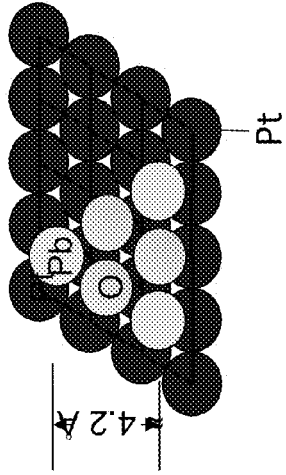

Fig. 21C
{001}-PbTiO$_3$ with {100}-Half-PbO Unit Cell Epitaxy on {111}Pt

Atomic Radius Dimensions
Pt = 1.39 Å
Ti$^{+4}$ = 0.86 Å
O$^{-2}$ = 1.26 Å
Pb = 1.32 Å

← 4.2 Å →

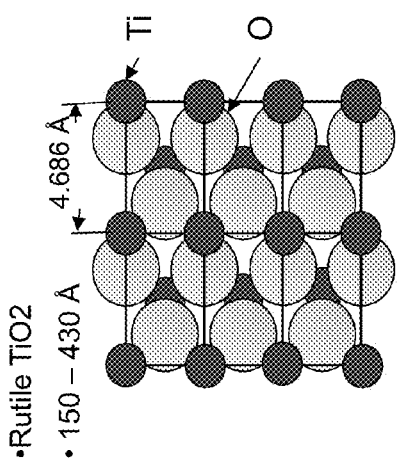

Fig. 21B  Sputter-Deposited Platinum Epitaxy Pt on TiO$_2$
- 300 s conditioning run
- 500°C, 0.5 kW, 30.5 sec wafer deposition, 50 sccm Ar 5x10$^{-3}$ mbar
- 1.25 Ohms/sq.
- Cubic O$^{-2}$  Ti$^{+4}$ Pt ← a$_0$√2 = 5.550 Å →

Mismatch relative to Pt lattice = 6.34%

Pt falls into interstices of rutile

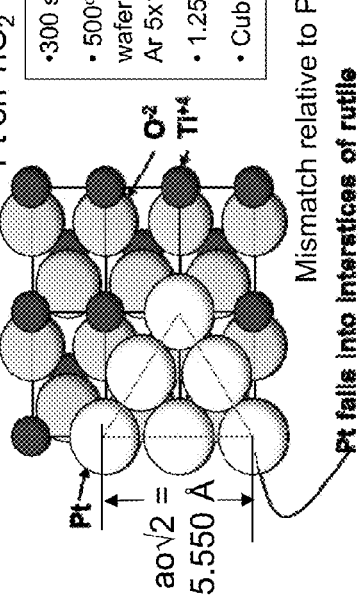

Fig. 21D {111}-PZT PbO-Terminated Stylo-Epitaxy on {111}Pt

Pt
Pb
O

← 4.2 Å →

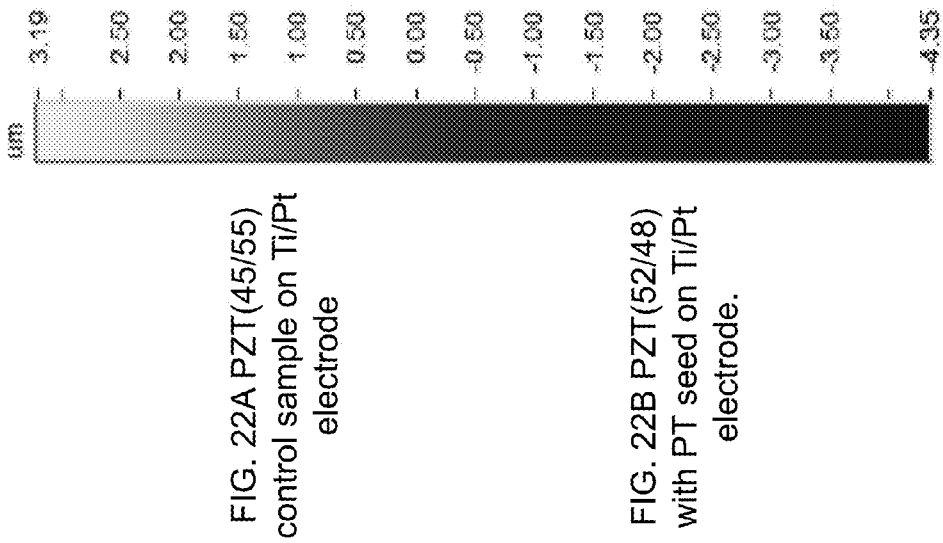
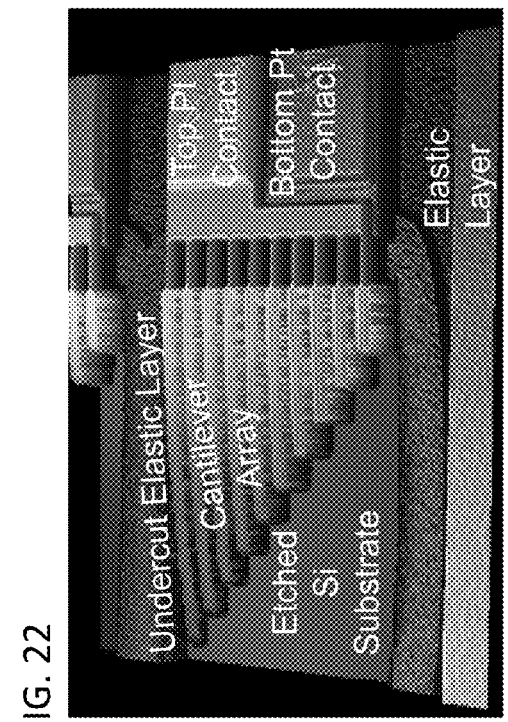
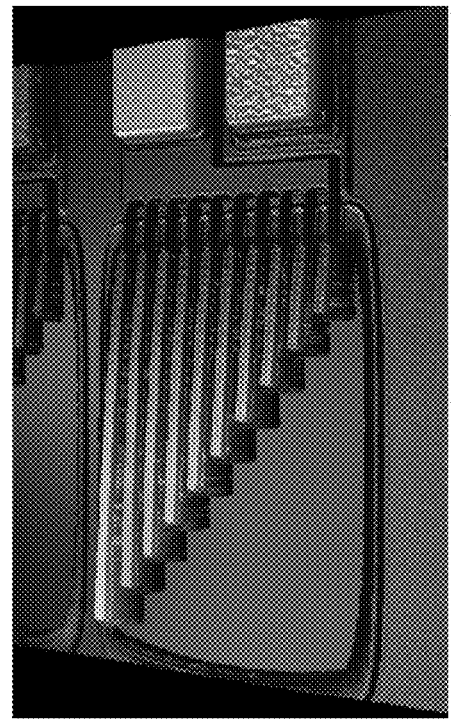
FIG. 22
FIG. 22A PZT(45/55) control sample on Ti/Pt electrode
FIG. 22B PZT(52/48) with PT seed on Ti/Pt electrode.

Fig. 24 — Growth of {111}-stylo-epitaxy

| | |
|---|---|
| 18C- {111}-textured Electrode (10-300 nm) | 18 {111}-textured Pt (100 nm) |
| 17C- {001}-textured Perovskite ferroelectric | 17 {001}-textured PZT |
| 15C- {001}-textured Perovskite Seed | 15' {001}-textured PbTiO₃ |
| 14C- {111}-textured Electrode (10-300 nm) | 14 {111}-textured Pt (100 nm) |
| 13C- Texture Oxide or Nitride (1 - 200 nm) | 13 {100}-texture TiO₂ (30 - 50 nm) |
| Amorphous Oxide or Nitride 12C | 12 SiO₂ |
| Substrate 11C | 11 Si |

Relative to FIG. 3A, the embodiments shown in FIG. 24 do not show a PZT seed layer 16 and do show a PbTiO₃ layer 15' instead a TiO₃ layer 15 in FIG. 3A

PROCESS FOR MAKING LEAD ZIRCONATE TITANATE (PZT) LAYERS AND/OR PLATINUM ELECTRODES AND PRODUCTS THEREOF

CROSS REFERENCE TO RELATED APPLICATIONS

This application is a continuation-in-part application of and claims priority U.S. patent application Ser. No. 14/219,028 entitled "Stylo-Epitaxial Piezoelectric and Ferroelectric Devices and Method of Manufacturing," filed Mar. 19, 2014, which is a continuation-in-part application of and claims priority to U.S. application Ser. No. 13/436,349 entitled "Stylo-Epitaxial Piezoelectric and Ferroelectric Devices and Method of Manufacturing," filed Mar. 30, 2012, now abandoned, which claims priority to Provisional Application No. 61/547,990 entitled "Stylo Epitaxial Piezoelectric and Ferroelectric Devices and Method of Manufacturing," filed Oct. 17, 2011, and Provisional Application No. 61/547,879 entitled "Thermally Oxidized Seed Layers for the Production of {001} Textured Electrodes and PZT Capacitors," both of which were filed on Oct. 17, 2011. All of the above applications are hereby incorporated by reference.

STATEMENT OF GOVERNMENT INTEREST

The embodiments herein may be manufactured, used, and/or licensed by or for the United States Government without the payment of royalties thereon.

BACKGROUND OF THE INVENTION

A wide variety of the physical properties of materials, such as ferroelectricity, ferromagnetism, piezoelectricity, conductivity, and dielectric permittivity depend upon material anisotropy and are therefore strongly affected by crystallographic texture, as reported in M.D. Vaudin, et al., "Accuracy and Reproducibility of X-ray Texture Measurements on Thin Films," Mat. Res. Soc. Symp. Proc., Vol. 721, entitled "Magnetic and Electronic Films-Microstructure, Texture and Application to Data Storage," edited by P. W. DeHaven et al. (Mat. Res. Soc., Warrendale Pa., 2002) pp. 17-22. With the appropriate choice of thin film texture, device operating efficiency and reliability can be strongly affected. Therefore texture is one critical factor for thin film process control and is fundamental to device reproducibility Lead zirconate titanate ($Pb(Zr_xTi_{1-x})O_3$ or PZT) exhibits piezoelectric properties in thin films and is the most widely used piezoelectric bulk ceramic with ferroelectric properties. Examples of the use of thin films of PZT (used to create large force, large displacement actuators) include actuators for RF switches, relays and inkjet print heads.

To date, at least two approaches have been taken to produce lead zirconate titanate (PZT) thin film devices with the spontaneous polarization normal to plane of the film and thus normal to the planar capacitor device, i.e. {001}-orientation. It is noted that directions in crystal lattices are defined in terms of directions l, m, and n, known as the Miller indices. Indices {1,0,0}, {0,1,0} and {001} represent planes orthogonal (normal) to the l, m, and n directions, respectively. The crystallographic directions are lines linking nodes (atoms, ions or molecules) of a crystal. Similarly, the crystallographic planes are planes linking nodes. Some directions and planes have a higher density of nodes; these dense planes have an influence on the behavior of the crystal. The notation {001} denotes the set of all planes that are equivalent to (001) (as shown in FIG. 2) by the symmetry of the lattice. Heteroepitaxial growth makes use of a crystal substrate to initiate growth of an overlying crystalline material that has a different crystal structure than the substrate. Either a polar or a non-polar substrate may be used to initiate growth of a polar film. Further discussion of spontaneous polarization is found in FIG. 8 of U.S. Patent Application No. 2010/0006780 and U.S. Pat. No. 7,956,369, herein incorporated by reference.

The piezoelectric coefficient of PZT is inherently linked to its crystalline quality. The highest magnitude piezoelectric coefficients are observed at the PZT morphotropic phase boundary (MPB) (See FIG. 1), where the crystal structure changes abruptly between the tetragonal and rhombohedral symmetry. The MPB is located at $PbZr_{0.52}Ti_{0.48}O_3$, or PZT (52/48), and is the composition in which both the dielectric permittivity and piezoelectric coefficients reach a maximum. In thin film form, the composition and the crystalline texture must be controlled to achieve the maximum piezoelectric coefficients. For PZT (52/48), the highest coefficients are reported for a {001} textured PZT (52/48). The increased piezoelectric response and poling efficiency near to x=0.52 is due to the increased number of allowable domain states at the MPB. At this boundary, the 6 possible domain states from the tetragonal phase <100> and the 8 possible domain states from the rhombohedral phase <111> are equally favorable energetically, thereby allowing a maximum 14 possible domain states.

Most previous publications and patents do not appear to provide a complete description of the {001}-texture inasmuch as it is insufficient to just state independently just the percentage of {100}-textured grains or {001}-textured grains or angular distribution width of the textured grains. In order to fully define a texture and the crystallographic efficiency (or figure of merit) of the texture, the volume fraction of the {100}-oriented grains relative to the total volume of the PZT film should be defined. Of that volume fraction, then the volume fraction of the {001}-oriented grains should be defined. And finally, the misalignment distribution of the {001}-oriented grains relative to the substrate normal (which is also the electric field direction of the device) should be defined. When these crystallographic parameters are defined, a figure-of-merit for the material can be calculated. The present invention is directed to producing an improved PZT ferroelectric with a high efficiency or figure-of-merit.

U.S. Pat. No. 6,682,772, to Fox, et al, entitled "High temperature deposition of Pt/TiOx for bottom electrodes," hereby incorporated by reference, has been reported for a bottom electrode consisting of $TiO_2$/(111)-textured Pt which resulted in improved PZT ferroelectric capacitor electrical characteristics for FRAM applications.

SUMMARY OF THE INVENTION

A preferred embodiment of the present invention is directed to an in-situ process (no removal of sample wafer from chamber (or sealed enclosure) containing the sputter deposition tool between initial loading of wafer with thermal-$SiO_2$ film on Si and final top electrode deposition; allowing wafer exposure only to purified Ar or $O_2$ flow or vacuum within the chamber). Steps of a preferred embodiment include: (1) Oxygen anneal of clean sputtered-Ti (without requiring plasma cleans) with the anneal occurring in the PZT sputter chamber resulting in orientation improvement in $TiO_2$ obtained by preserving a pristine Ti surface; (2) $TiO_2$ seed layer deposited on the Pt bottom electrode & annealed in PZT sputter chamber; (3) sputter deposited PZT on the clean TiO$_2$ seed layer with strong 001 texture; (4) this oriented PZT acts as a seed for orienting the top Pt electrode in the (100) direction.

A preferred embodiment of the present invention comprises a series of layers used to create 001 textured PZT with a bottom and top electrode. The layers comprise a highly 100 oriented, textured titanium oxide (TiO$_2$) rutile seed layer 13 (see FIG. 3A); a 111 textured 111 oriented, textured Pt layer 14, a highly 100 oriented, textured titanium oxide (TiO$_2$) rutile seed layer 15 with lead oxide exposure during oxygen anneal in the PZT chamber to make it lead titanate (PTO)-like: a 001 oriented, textured lead zirconate titanate (PZT) seed layer 16; a 001 oriented, textured lead zirconate titanate (PZT) layer 17, and a 100-oriented platinum top electrode 18. The structure may be formed on a suitable substrate. Experimental evidence indicates that for the in-situ process, the Ti deposition for the Ti seed 15 and its oxidation anneal are important, and there is x-ray diffraction evidence that Pb oxide is present. The preferred embodiment obtains 001 oriented PZT on Pt/TiO$_2$ and provides a technique for single (or multilayer) sputtered PZT structures while using the dense Pt/TiO$_2$ to avoid Pb diffusion into the substrate enhancing thermal and electrical cycling endurance for superior polarization retention.

BRIEF DESCRIPTION OF THE DRAWINGS

The embodiments herein will be better understood from the following detailed description with reference to the drawings, in which:

FIG. 2 is a diagrammatic illustration showing the orientation of a polar material relative to the growth direction. An approach to obtaining a {001}-orientation for the PZT is to use a seed layer and/or variations in process conditions to produce a {001}-textured PZT film or layer whereby the PZT {001}-planes lie parallel to the substrate plane, the orientation of the c-axis of a crystal's structure (with c-axis being defined as perpendicular to the c-plane) relative to the growth plane, which in this example is the sample surface. Shown to the right is the relative orientation of PZT{001}, Pt (Pt (100), and wafer. For Pt, note 100, 010, and 001 are equivalent because the structure is cubic. Pt (Pt (111) is along the body diagonal.

FIG. 3A schematically illustrates a preferred method of constructing a preferred embodiment wafer stack showing the various layers. FIG. 3A shows a sequence of in-situ sputter thin-film layer processing steps from wafer load step (1) to unload step (7).

FIG. 3B schematically depicts how the Ti seed is produced using a Pb/Ti/O seed surface.

FIG. 4 is a schematic illustration of an exemplary in-situ containment system for carrying out a preferred method of the present invention. The Clusterline system comprises an etch chamber (PM2), process modules (PM1, 3-5) and connecting (shared) vacuum transfer chamber (center) for wafer load-unload into and out of wafer boats and chamber-to-chamber transfer.

FIG. 5 is an illustration of cathode sputtering of material released from target (B), due to bombardment by gas ions, onto substrate (11) [REF: Oerlikon Clusterline 200 Sputtering System Instructions, Edition 12/2001, p. 48]

FIG. 6 is an illustration showing an X-ray diffraction (XRD) scan for sputter PZT on Pt (Pt (100 nm)/TiO$_2$ (30 nm). The TiO$_2$ Pt-template was obtained by ex-situ annealing 20 nm of sputtered Ti in the furnace at 750° C., 30 min, 3 SLM O$_2$.

FIG. 10 is an illustration showing Test wafers (A-1) prepared with 20 nm of sputtered-Ti on SiO$_2$/Si(100), then oxygen annealed to convert the 20 nm thick Ti into TiO$_2$ with nominal thickness of 30 nm. Oxygen anneal matrix (A-2). 100 nm of sputtered Pt (A-4). The points where XRD measurements are taken are noted (A-3 & A-5). The Ti in-situ anneal (I) exposes the sample to lead oxide vapor in the PZT sputtering chamber (620° C. or 720° C.). After removal from the deposition system, Ti ex-situ anneal samples (E) were furnace annealed at 750° C., 30 min, 3 SLM O$_2$. Since seed layer thickness is only a few nanometers, too small to measure directly by XRD, these monitors provide XRD feedback about the impact of the oxygen anneal environment on both the 30 nm TiO$_2$ template (for sputtered Pt bottom-electrode growth) and the TiO$_2$ seed layer (on the Pt) for PZT growth.

FIGS. 11A-E illustrate oxidation & TiO$_2$—Pt correlation for test wafers 3, 6, 10, and 13 with O$_2$ anneal at either 620° C. or 720° C., as described in the table in FIG. 11A (Graph 1) and in FIG. 10.

FIG. 11A is a TiO$_2$ (200) XRD scan for 30 nm TiO$_2$.

FIG. 11B is a TiO$_2$ (200) rocking curve XRD scan.

FIG. 11C illustrates Pt (222) XRD scan for 100 nm of 111 oriented Pt on 30 nm TiO$_2$ FIG. 11D is a rocking curve XRD scan for Pt (222).

FIG. 11E is a comparison of Pt (222) and TiO$_2$ (200) rocking curve FWHM or RC-FWHM. In FIG. 11E, improvement of TiO$_2$ and Pt quality is significant for either: (i) a 720° C. in-situ anneal in the PZT chamber or (ii) a 620° C. in-situ anneal in the PZT chamber followed by the furnace anneal (F) at 750° C., 30 min, 3 SLM O$_2$. The data point for 720° C., circled in red, indicates operating point chosen for subsequent use in the in-situ process.

FIGS. 12A through 12D illustrate XRD showing the change in quality of PZT on Pt/TiO$_2$ with variation of TiO$_2$ seed thickness obtained with in-situ process for Wafers 228-233. Ti deposition times were 0-5 s and TiO$_2$ seed thicknesses after oxygen anneal at 720° C. were 0-5 nm. The optimum condition occurs for Wafer 231 at 3 s Ti deposition on the Pt surface oxidized in the PZT chamber at 720° C., 1800 s (3 nm TiO$_2$), FIG. 12 A (Graph 1) shows that strong lead oxide peaks are present in the PZT for the case of no TiO$_2$ seed (Wafer 228, Ti deposition time=0 s, Pt annealed in PZT chamber at 720° C., 1800 seconds).

FIG. 12 B (Graph 2) shows PZT {001} orientation as a function of Ti seed layer deposition time with the maximum {001} orientation for 3 s Ti deposition time.

FIG. 12 C (Graph 3) illustrates PZT 101 and 110 orientations as a function of Ti seed layer deposition time with the minimum (including no PbO or pyrochlore) occurring for 3 seconds Ti deposition time.

FIG. 12 D (Graph 4) illustrates PZT 111 orientation as a function of Ti seed layer deposition time with no evidence of 111 orientation for 3 seconds Ti deposition time.

FIG. 18 is an illustration showing a Plan-view SEM. It shows rectangular features with up to 100-200 nm edge length on the sputtered PZT surface.

FIG. 19 is an illustration showing electrical data (Pmax, Prem, leakage current, ε33, and tan δ) for 450 nm thickness sputtered PZT deposited by the in-situ process with 500 nm thermal SiO$_2$ elastic layer (Pt or IrO$_x$ top electrode). Data for 500 nm CSD PZT with Pt top electrode is shown for comparison.

FIG. 20 illustrates a multilayer PZT device with a sequence of Pt-PZT bi-layers/

FIG. 21A illustrates, as a preferred embodiment example, a TiO$_2$ layer 13 and a depiction of the atomic packing of the rutile TiO$_2$ structure as viewed along the [100]-direction.

FIG. 21B illustrates, as a preferred embodiment example, sputter-deposited platinum stylo-epitaxial layer 14 and the registration of the Pt atoms in the (111) plane with the interstices of the TiO$_2$ rutile oxygen plane as viewed along the [100]-direction. The (111)-Pt and (100)-TiO$_2$ crystal structure registration occurs on a grain-by-grain basis.

FIG. 21C is an illustration on the atomic scale of the registration of the Pb-terminated (001)-PbTiO$_3$ plane or the (100)-plane of a PbO half unit cell epitaxy on the (111) Pt plane.

FIG. 21D is an illustration on the atomic scale of the registration of the PbO-terminated (111)-PZT plane epitaxy on the (111) Pt plane.

FIG. 22A is an illustration showing a cantilever array comprising PZT (45/55) control sample on Ti/Pt electrode. Similar structures have been made using sputtered PZT.

FIG. 22B is an illustration showing a cantilever array comprising PZT (52/48) with PT seed on Ti/Pt electrode. Similar structures have been made using sputtered PZT.

FIG. 23 also shows the effect of the PbTiO$_3$ seed layer on PZT (52/48) compared to without the seed layer in PZT (52/48).

FIG. 24 is a cross-sectional illustration showing specifically the addition of a {001} stylo-epitaxy, textured layer 16 (perovskite seeded).

DETAILED DESCRIPTION OF PREFERRED EMBODIMENTS

Figure 1:
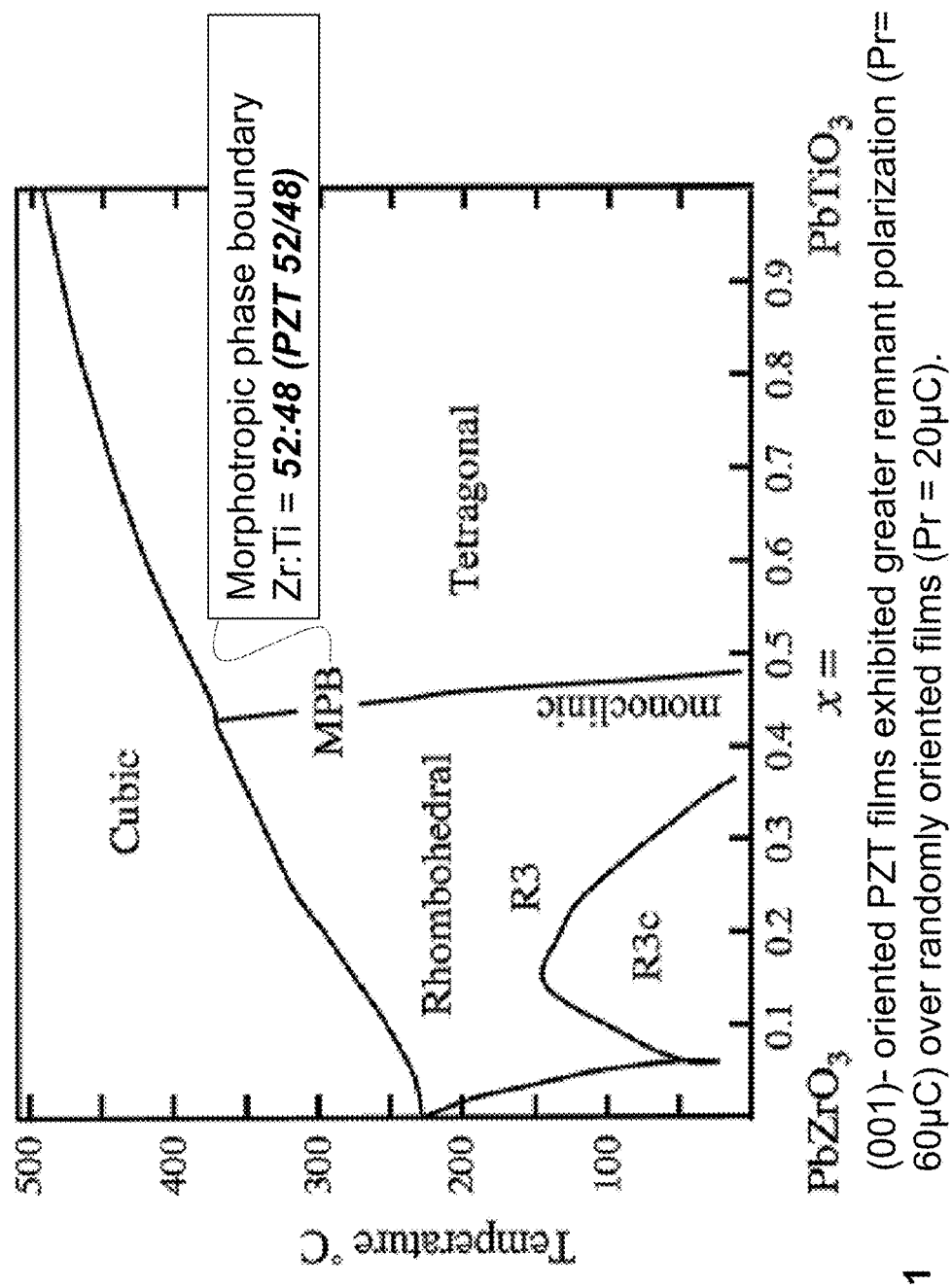
FIG. 1 is a graphical illustration of crystal structures as a function of the ratio of PbZrO$_3$/PbTiO$_3$, including morphotropic phase boundary (MPB) located at or about Zr:Ti=52:48. Films in both the tetragonal region of the phase diagram with (001) orientation and films in the rhombohedral region of the phase diagram with (111) orientation exhibit large piezoelectric properties. Films at the MPB (PZT (52/48)) with (001)-orientation show the largest piezoelectric properties, which is the preferred PZT stoichiometry for the PZT mentioned throughout this application.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. The layers and/or regions illustrated in the figures are schematic in nature and their shapes are not intended to illustrate the precise shape of a region of a device and are not intended to limit the scope of the present invention. The layers are not drawn to relative scale. Moreover, variations from the shapes are to be expected. Thus, embodiments of the present invention should not be construed as limited to the particular shapes of regions illustrated herein but are to include deviations in shapes. For example, a region illustrated as a rectangle may have a variety of configurations without deviating from the present invention and/or may have tapered, rounded or curved features.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

A substance which has a natural charge separation in the absence of a field is called a polar material. As used herein, the terminology "polar" in conjunction with material relates to the orientations of the polar material. Specifically, FIG. 2 shows the orientation of the c-axis of a crystal's structure (with c-axis being defined as perpendicular to the c-plane) relative to the growth plane, which in this example is the sample surface. In the polar orientation example shown in FIG. 2, the c-axis is perpendicular to the growth plane.

A piezoelectric develops a voltage (or potential difference) across two of its faces when compressed (useful for sensor applications), or physically changes shape when an external electric field is applied (useful for actuator applications). The dielectric constant of PZT can range from approximately 300 to 3850 depending upon orientation and doping.

Lead zirconate titanate, Pb $(Zr_x Ti_{(1-x)})O_3$, (also known as PZT) exhibits piezoelectric properties and is used to create large force, large displacement actuators and sensors. PZT is one of the most economical ceramics that exhibits a high piezoelectric coefficient, allowing for the use of lower voltages to achieve the same actuator performance metrics. It is highly desired to achieve highly {001} textured PZT (52/48). Proper control of the crystalline texture allows an increase in the piezoelectric stress constant as shown by N. Ledermann, et. al. "Textured, piezoelectric Pb$(Zr_x, Ti_{(1-x)})O_3$ thin films for MEMS: integration, deposition, and properties." Sensors and Actuators A 105, 162 (2003), with random order PZT (52/48) −e31,f of ~7 C/m$^2$ and (100) oriented PZT (52/48) exhibiting 12 C/m$^2$, close to 60%. These improvements will result in substantial improvements in device performance including lower actuation voltages, higher force actuation, and lower power consumption. Through the use of a chemical solution derived PbTiO$_3$ seed layer based on the work of Paul Muralt et. al. "Texture Control of PbTiO$_3$ and Pb(Zr,Ti)O$_3$ Thin Films with TiO$_2$ Seeding." Journal of Applied Physics Vol. 83, Issue 7, pp. 3835-3841 (1998), combined with optimal processing conditions for the solution chemistry, platinum (Pt) electrode texture, and rapid thermal annealing (RTA) conditions of the PZT films, PZT (52/48) thin films having a {001} texture in excess of 95% are achievable.

The piezoelectric coefficient of PZT is inherently linked to its crystalline structural quality. The highest magnitude piezoelectric coefficients are observed at the PZT morphotropic phase boundary (MPB), shown diagrammatically in FIG. 1, where the crystal structure changes abruptly between the tetragonal and rhombohedral symmetry. At the MPB, the dielectric permittivity and piezoelectric coefficients reach a maximum. The MPB is located approximately at PbZr$_{0.52}$Ti$_{0.48}$O$_3$, also known as PZT (52/48), composition, as shown in FIG. 1.

Highly beneficial results have been obtained from achieving highly {001} textured PZT (52/48). Proper control of the crystalline texture provides a 30-50% increase in the piezoelectric stress constant as shown by Ledermann et. al. with random order PZT (52/48) −e31,f of ~7 C/m$^2$ and (100) oriented PZT (52/48) exhibiting 12 C/m$^2$, close to 60%. These improvements result in substantial improvements in device performance including lower actuation voltages, higher force actuation, and lower power consumption.

FIG. 2 is a diagrammatic illustration of the orientation of the c-axis of a crystal's structure (with c-axis being defined as perpendicular to the c-plane) relative to the growth plane, which in this example is the sample surface. Shown to the right is the relative orientation of PZT{001}, Pt (100), and wafer. For Pt, note 100, 010, and 001 are equivalent because the structure is cubic. Pt (111) is along the body diagonal.

Figure 3C:
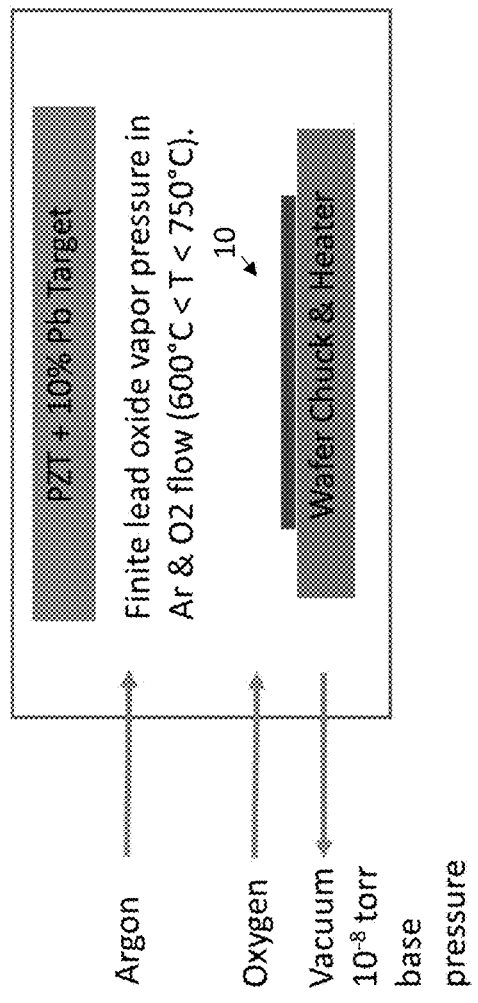
FIG. 3C schematically depicts the sputtering of 001 textured PZT corresponding to the steps 5 and 6 in FIG. 3A.

Referring now to FIG. 3A, as an example of a preferred method preparation, a (100) silicon wafer or substrate 11, which may be, for example, approximately 100-150 mm in diameter, is coated with 500 nm of thermally deposited silicon dioxide ($SiO_2$) thin film 12. As an improvement over the process disclosed in U.S. patent application Ser. No. 14/219,028, a preferred methodology is an in-situ process (no exposure of the wafer to an environment containing undesired gases and/or particles from the time of the initial loading of wafer with thermal-$SiO_2$ film on Si to the final top electrode deposition; preferably allowing wafer exposure only to purified Ar or $O_2$ flow or vacuum).

Referring now to FIG. 3A, a preferred method comprises the following steps, preferably in the following sequential order:

STEP (1). Load thermal $SiO_2$ coated Si wafer ($SiO_2$ {500 nm}/Si(100)) in deposition chamber.

STEP 2. Sputtering of Ti (001), 500 W, Ar 30 sccm, 40° C., 30 sec and oxygen anneal 720° C., 30 min to create $TiO_2$ (100) rutile as a template for Pt sputter deposition.

STEP 3. Sputtering of Pt (111), approximately 100 nm (500 W, Ar 50 sccm, at a temperature of 500° C.

STEP 4. An oriented rutile $TiO_2$ seed layer of approximately 5 nm thickness is created on top of the Pt (Ti 500 W, Ar 30 sccm, 40° C., 30 sec and oxygen anneal 720° C. 30 min to create the $TiO_2$ seed for PZT deposition). At the time of the creation of the $TiO_2$ seed layer, there is exposure to a lead oxide environment in the PZT chamber, in which the oxygen anneal is done so that the $TiO_2$ seed can take on lead content to improve its ability to orient and grow sputtered PZT. Creating the $TiO_2$ seed layer in a lead oxide environment free from air contamination produces a lead titanium rich surface for growth of sputtered PZT.

STEP 5. Sputtered PZT seed layer, 65 nm, 620-720° C.

STEP 6. Sputtered textured PZT, 500 nm, 720° C.

STEP 7. Creating the top layer Pt (100) (100 nm, 500° C.) or $IrO_2$ (500° C., 30-500 nm, oxygen anneal).

The preferred method of the present invention only exposes deposition surfaces to system vacuum and/or pure Ar or $O_2$ gases during processing in Steps 1-7. The anneal chamber used for Ti anneals is a Pb-Oxide containing environment from Pb available from the PZT target and material previously deposited on the shield and inner chamber surfaces.

The process illustrated in FIG. 3A preferably uses an "all-sputtering approach" to a PZT process so that all processing is done without exposure to air contaminant (sample remains in the cluster tool environment (FIG. 4) through all steps. This is beneficial for cleanliness of Pt (step 3) and the oriented rutile $TiO_2$ (100) seed layer (step 4). Alternately, a container could be used to transfer the wafer between chambers (such as between chambers PM1, PM4 and PM6), whereupon the wafer would be loaded into and out of the sealed container in order to move it between chambers and expose the wafer to impurities in the air. FIG. 3A shows the ordered layer of stacks, grown using the all in-situ sputter deposition process for PZT with oriented rutile $TiO_2$ (100) seed layer. The preferred "all in-situ sputtered approach," i.e., when all layers are deposited by sputtering, in comparison to the traditional mixed approach of sputtered and chemical solution deposition (CSD), enhances the $TiO_2$ template for 111 oriented bottom Pt electrode sputter deposition to create a {001} oriented, optimized PZT sputtered deposited film whose thickness can range from nanometers to micrometers in thickness with less than one-tenth the deposition time of CSD PZT in a process which under these conditions significantly reduces secondary phase impurities.

As a preferred option for performing STEP 1 of the preferred method illustrated in FIG. 3A, the initial wafer that goes into the Clusterline tool or system is a 100 oriented Si wafer 11 on which a 500 nanometers $SiO_2$ is thermally grown usually by a wet (using $H_2O$) furnace treatment at elevated temperatures. The $SiO_2$ surface is preferably flat (<<3% error). The structure of the $SiO_2$ film 12 is amorphous (no preferred orientation) and is also the elastic layer for when the PZT with top electrodes is made into actuators, filters and other devices that make use of the cantilever whose motion is controlled by applied currents. The elastic layer has the function of tailoring the stiffness of the cantilever. On top of the $SiO_2$ is produced the 100 oriented $TiO_2$ (layer 13) 30 nanometers thickness on which to grow the 111 oriented sputtered Pt (layer 14). This process uses the same 001 oriented Ti deposition in the first chamber (PM 1) of the clusterline tool as is reported in U.S. Pat. No. 8,866,367 and U.S. Patent Published Application No. 20130093290, herein incorporated by reference. However, the furnace anneal described in the U.S. Pat. No. 8,866,367 and U.S. Patent Published Application No. 20130093290 is replaced with an oxygen anneal at 100 sccm Ar flow and 10 sccm oxygen flow in the PZT (sixth) chamber (PM #6 in FIG. 4) at a temperature in the range of 600-740° C. The 100 nanometers Pt (111) (layer 14) on top of the 30 nanometers $TiO_2$(100) (layer 13) is sputtered in the fourth chamber (PM 4 in FIG. 4) using the same process as was previously reported in U.S. Pat. No. 8,866,367 and U.S. Pat. No. 13/436,349. Those of ordinary skill in the art would recognize the chamber numbers are purely arbitrary as an example of using a containment device having a series of chambers, and another series of chambers or containment device may be used without departing from the invention.

After the Ti (001) deposition in Step 2 of FIG. 3A, an oxygen anneal may be performed on the clean sputtered-Ti (with no plasma cleans necessary or required) with the anneal occurring in the PZT sputter chamber resulting in orientation improvement in $TiO_2$(100) obtained by preserving a pristine Ti surface. The temperature of the oxygen anneal may be approximately 750° C. and may alternately be performed ex situ, for example, in a Bruce Technologies tube furnace, to convert the Ti to $TiO_2$. Introduction of the oxygen anneals used to convert Ti into $TiO_2$ is conducted using the PZT chamber. The PZT chamber can introduce lead oxide into the $TiO_2$ template (for Pt growth) and into the oriented rutile $TiO_2$ (100) seed layer on Pt (for PZT growth). During the anneal, a Pb-Oxide containing environment is created from Pb available from the PZT target and material previously deposited on the shield and inner chamber surfaces. The presence of the lead oxide could enhance the template and seed layer to improve texture of Pt & PZT, respectively. In accordance with a preferred embodiment, the lead oxide environment exposure that is present during the $O_2$ anneals causes (1) potential lead oxide residue on $TiO_2$ surface on which Pt is sputter deposited. (2) potential lead oxide residue in oriented rutile $TiO_2$ (100) seed on top of the (bottom-electrode) Pt which the PZT was sputter deposited on. The $TiO_2$ (in Step 3 (labeled 13) of FIG. 3A) acts as a seed layer or template for {111} Pt nucleation with a Pt (222) rocking curve full width half maxima (FWHM) between 1.7°-2.3°. A 100 nm Pt film (Step 3 labeled 14 in FIG. 3A) was deposited at 500° C. using the Unaxis Clusterline 200 deposition system to provide a highly {111} textured Pt (layer 14). A textured titanium oxide ($TiO_2$) rutile seed layer 15 with lead oxide exposure during oxygen anneal in the PZT chamber to make it lead titanate (PTO)-like provides a template for {111} textured PZT film growth (referred to herein as TiO$_2$ on Pt). The Ti and the Pt may be deposited in separate dedicated process modules in the clusterline deposition system. A key aspect of the process is to perform substantially all of the process steps from SiO$_2$/Si(100) to top Pt without removing the sample wafer from the sputter tool in clean Ar, O$_2$, or system vacuum environment. In addition, a lead oxide environment with its potential positive effects may be used. Of particular importance is the ability to obtain 100 textured Pt for the Pt on top of the PZT {001}.

During Step 2 of FIG. 3A, an oxygen anneal of clean sputtered-Ti (with no plasma cleans necessary or required) occurs with the anneal preferably occurring in the PZT sputter chamber resulting in orientation improvement in TiO$_2$ obtained by preserving a pristine Ti surface. Note also, that similar to step 2, during Step 4 of FIG. 3A preferably the oriented rutile TiO$_2$ (100) seed layer is deposited on the Pt bottom electrode & annealed in the PZT sputter chamber. The sputter deposition of PZT on the clean oriented rutile TiO$_2$ (100) seed layer results in a strong 001 texture during Steps 5 and 6. The oriented PZT acts as a seed for orienting the top Pt electrode in the (100) direction (Step 7).

Referring now to step 3 of FIG. 3A, a bottom electrode 14 can be sputter deposited onto the silicon dioxide using a Unaxis Clusterline 200 deposition system schematically illustrated in FIG. 4. A similar process is detailed in Potrepka, et. al., "Pt/TiO$_2$ Growth Templates for Enhanced PZT Films and MEMS Devices," MRS Proceedings Session S, (mrsf10-1299-s02-04), Vol. 1299, (2010) (hereby incorporated by reference).

Referring now to steps 5 and 6 of FIG. 3A, the preferred method and/or embodiment of the present invention is accomplished by incorporating a seed layer 15 on the Pt surface 14 to be an enhanced template for PZT seed 16 and PZT layer 17. An important component of the preferred method or process is maintaining clean processing where the sample never leaves the chamber between initial SiO$_2$/Si and final top Pt. Unlike chemical solution deposition (CSD) which is labor intensive for making thick PZT films, the sputtering of PZT in steps 5 and 6 exceeds 4 microns thickness in a relatively short time and is therefore more easily deposited by automated processing. It is believed that the Pb-Oxide environment of the PZT sputter chamber may be creating a surface on the TiO$_2$ surface acting as a template for the bottom Pt sputter deposition so that the Pt (100) that is seen in the XRD could have a component from the bottom Pt and it is also believed that the oriented rutile TiO$_2$ (100) seed surface 15 or layer volume on top of the Pt bottom electrode 14 is used for PZT sputter deposition. Moreover, sputter deposition of platinum 18 on the oriented PZT creates a well oriented 100 top platinum electrode 18 (Step 7). This opens up the possibility of using a PZT or Pb-based or Pb—Ti-based seed layer with lattice parameter similar to that of PZT to obtain a 100 oriented bottom Pt electrode & stacks of PZT-electrode layers as shown for example in FIG. 20. Successive layers of a multilayer PZT device with a sequence of Pt-PZT bi-layers would benefit from having the top Pt from the prior bi-layer to be 100 oriented (as a growth template for sputtered PZT) and available for use as the bottom electrode for the next PZT deposition. Such a 100 oriented Pt electrode is superior to 111 oriented Pt as a template for enhancing 001 PZT growth. As seen in FIG. 20, three Pt (100) on PZT {001} bilayers on <5 nm TiO$_2$ seed (oxidized in PM6), on Pt (111).

Regarding Step 7 of FIG. 3A, the 100 Pt electrode is superior to 111 oriented Pt. See FIG. 9 which shows PZT deposited on Pt (111), the Pt oriented perpendicular to the wafer surface along the body diagonal of the Pt cubic unit cell. PZT can grow on Pt (111) but requires a PTO seed. PZT growth without PTO seed is possible on Pt (100). In addition, for Pt (100) growth on PZT{001}, the TiO$_2$(100) layer for Pt growth can be eliminated since the Pt grows directly on the PZT. PZT and Pt could each use the other as the growth template. See U.S. Pat. No. 13/436,349 and U.S. Pat. No. 8,866,367 to which this discussion is related.

Figure 8:
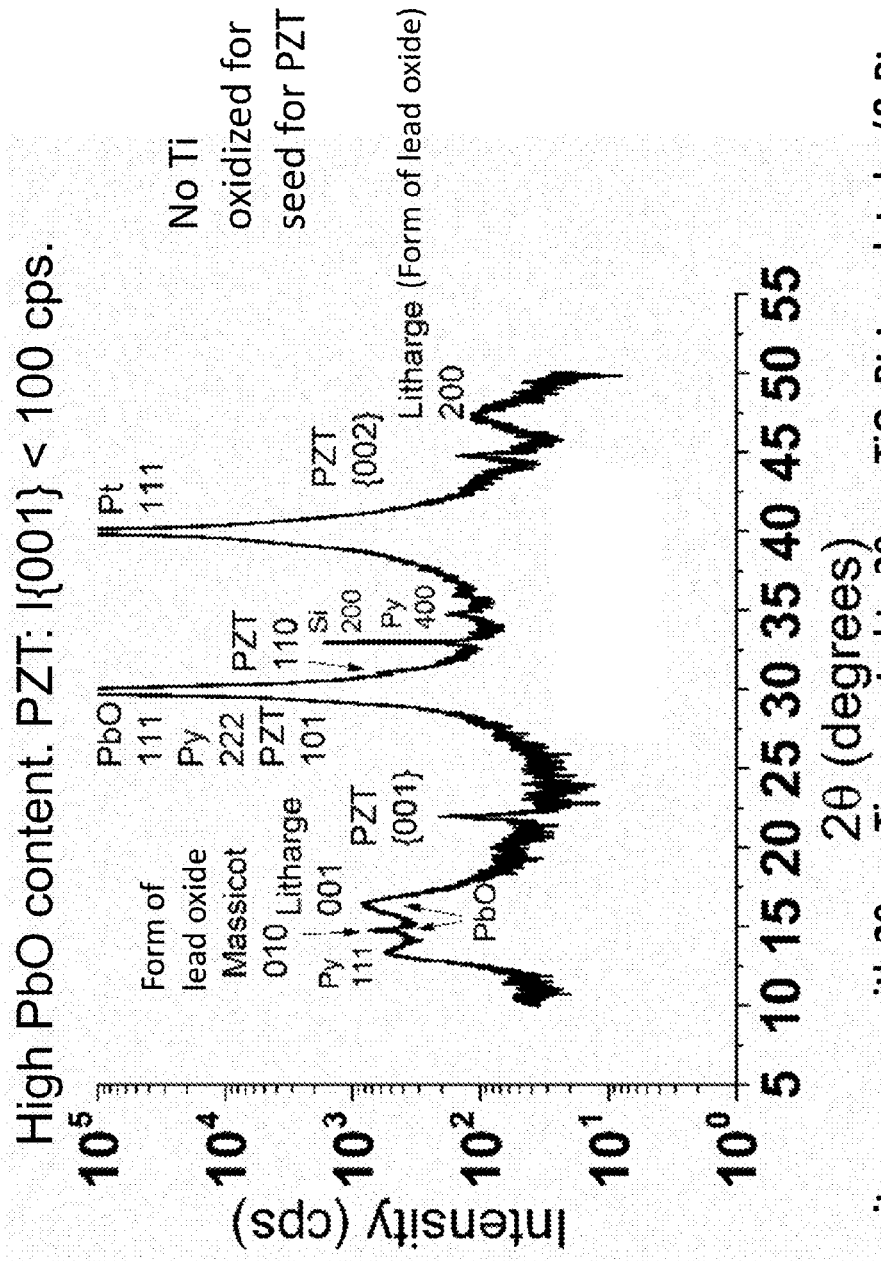
FIG. 8 is an illustration showing an x-ray diffraction (XRD) scan for sputter PZT on Pt (Pt (100 nm)/TiO$_2$ (30 nm) using an in-situ process (without removing sample from the sputter tool between loading SiO$_2$/Si(100) wafer and sputter deposition of the PZT. The TiO$_2$ for templating the Pt was obtained by an in-situ anneal of 20 nm sputtered Ti in a lead oxide environment (the PZT chamber) at 720° C., O$_2$ 10 sccm (MFC), 1800 s. The Pt surface was exposed to the same conditions in the PZT chamber. Exposing the Pt surface to the 720° C. lead oxide environment for 1800s of the PZT chamber without depositing the TiO$_2$ seed results in the PZT XRD spectrum being rich in lead oxide.
Figure 9:
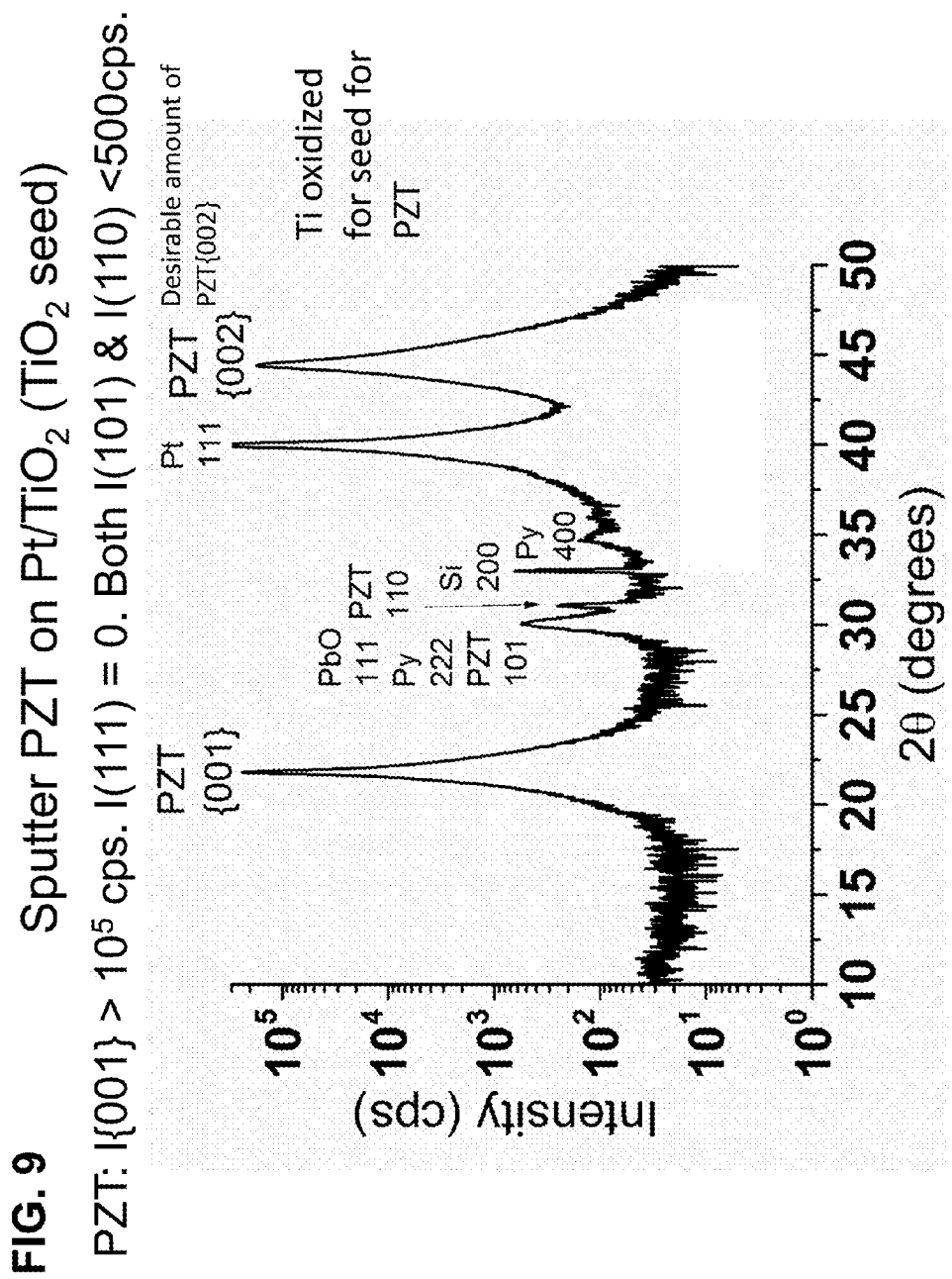
FIG. 9 is an illustration showing an x-ray diffraction (XRD) scan for sputter PZT on Pt (Pt (100 nm)/TiO$_2$ (30 nm) with 3 nm TiO$_2$ seed layer on the Pt electrode. All processing was in-situ (without removing sample from the sputter tool between loading SiO$_2$/Si(100) wafer and sputter deposition of the PZT. The Pt template and TiO$_2$ seed were obtained by annealing the Ti (of thickness 20 nm and 2 nm, respectively) in a lead oxide environment (the PZT chamber) at 720° C., O$_2$ 10 sccm (MFC), 1800 s. Exposing the Ti-coated Pt surface to the 720° C. lead oxide environment of the PZT chamber for 1800 s results in the PZT XRD spectrum being highly {001} oriented with minimal PbO, Py, and PZT 101 and 110.

The TiO$_2$ seed (<5 nanometers thickness) is made from Ti (<5 nanometers thickness) deposited in, for example, the first chamber (PM 1 of FIG. 4) and oxidized in the PZT sputter chamber (PM 6 of FIG. 4) with temperature and Ar and oxygen flow conditions as for the 30 nanometer thick TiO$_2$ layer described above. In chamber PM 6, because of the presence of the PZT target used for sputter PZT (the target is PbZr$_{0.52}$Ti$_{0.48}$O$_3$ with a 10 percent lead excess) and the 600-740° C. temperature applied to the chuck to heat the sample wafer, when oxidizing Ti in PM 6 there is exposure to lead oxide. As a result, the TiO$_2$ seed and the surface of the 30 nanometer TiO$_2$ are not pure TiO$_2$ but contain lead too creating a material that contains lead and titanium in it, more like PbTiO$_3$. The evidence for this is in FIG. 8 showing the PZT growth on the PbO-on-Pt with PbO XRD peaks present and FIG. 9 showing that PZT growth on Pb/Ti/O-on-Pt is {001} oriented.

As depicted in FIG. 3A, on top of the lead-containing TiO$_2$ seed (Layer 15), a {001} PZT seed is sputter deposited at 620-720° C. in PM 6 (Layer 16). This PZT seed layer 16 is about 65 nanometers thick. Then the main {001} PZT layer 17 (referred to as the sputtered textured PZT in FIG. 3A above) is sputter deposited at 720° C. PZT layers 17 have produced at 500 nanometers to 4 microns thickness. A final top electrode 18 is sputter deposited on top of the sputtered PZT (17). Using the Pt sputter process, one can get a 100 oriented Pt top electrode for Layer 18. Another top electrode process is used; sometimes involving IrO$_2$. When IrO$_2$ is used, x-ray diffraction shows that the bottom Pt electrode does not have 100 orientation.

Referring now to FIG. 4, in order to provide a sealed, controlled environment, a sputtering source such as for example, a CLUSTERLINE® 200 process module, may be used and equipped with a magnet system (planar magnetron technology positioned behind the target). The magnet field compels the free electrons to additional circular movements so that they all move in helical (screw-like) paths. This lengthens the electron path and therefore increases the probability of electron and gas atom collisions. In turn, a higher degree of dissociation for the process gas is produced and the plasma density is increased. As another example, <<planar magnetron>> technology offers the following advantages over conventional sputtering methods: (1) very stable plasma; (2) increased sputter rate; (3) lower sputter voltage (i.e. low particle energy) and (4) can also be used at low levels of gas pressure.

Sputtering Process

FIG. 5 Illustrates one type of sputtering process that can be used in conjunction with the preferred method shown in FIG. 3A. A description and examples of other types of sputtering that can be used in conjunction with the present invention can be found in Oerlikon Clusterline 200 Sputtering System Instructions, Edition 12/2001 (December 2001). The cathode sputtering process shown in FIG. 5 is a process used to produce thin films. Ion bombardment removes particles of coating material from a target. These particles are deposited and settle on a substrate. A plasma (an ionized gas) is required to execute a sputtering process. A plasma can be created by subjecting a gas at reduced pressure to an electrostatic field or a high frequency alternating field.

As to the ignition stage of plasma, using argon as process gas, the gas is incited to produce a plasma by subjecting it to an electrostatic field. The negative pole of the voltage is applied to the target, i.e. the target constitutes the cathode. The positive pole of the voltage is generally connected to the housing ground. Ionizing radiation (cosmic radiation and natural radioactivity) is always present. As a result, each gas contains a small amount of gas ions. This means that some atoms in the process gas are split up into positive argon ions and negative electrons in accordance with the following chemical reaction: $Ar \rightarrow Ar^+ + e^-$.

The electric field accelerates the argon ions to the cathode and the free electrons to the anode. In the process, the accelerated electrons collide with further atoms and ionize these atoms with their kinetic energy. The above process is repeated continuously and therefore produces an avalanche of argon ions and electrons resulting in the ignition of the plasma.

The pressure of the process gas must be within a range of approx. $10^{-4}$ to $10^{-1}$ mbar in order to maintain the plasma at a negative voltage of a few hundred volts. When the pressure level is set too high, the accelerated electrons will collide with the gas atoms before they can achieve the minimum energy that is required for ionization. On the other hand, when the pressure is too low, the particle number density is reduced and the probability of collision decreases.

As to sputtering, subsequent to plasma ignition, large amounts of positive argon ions impact on the target, as depicted in FIG. 5. Their high mass gives them a high level of impulse transmission. This is transferred to the atoms on the target surface and thus causes single atoms or whole clusters of atoms to be removed. Ion impact also generates heat and this in turn, induces undesirable target heating. The target is therefore cooled with water.

As to deposition (titanium layer 13 FIG. 3A and FIG. 3B for example), the atoms removed from the target move freely inside the process chamber and then settle on the substrate and other surfaces. Appropriately positioned masks allow for localized material coating on the substrate. This procedure is called <<sputtering>> or <<deposition>>. FIG. 5 illustrates the typical circumstances, i.e. the substrate carrier (comprising Layer 12 in FIG. 5) is positioned parallel to and opposite the target.

In accordance with the present invention, during steps 5 and 6 of FIG. 3A, textured 001 PZT may be obtained similar to PZT on seed layers of Pb-rich PZT in analogy to $PbTiO_3$ deposited by chemical solution deposition (CSD), providing an all-sputtered material approach with all processing done in the deposition tool environment using Ar, $O_2$, system-vacuum, and the lead oxide vapor pressure of the PZT sputter chamber. In order to monitor the XRD signal for $TiO_2$ by XRD analysis, 30 nm thick $TiO_2$ films were produced on $SiO_2$/Si(100) under the same conditions used for the $TiO_2$ seed layer showed Ti rocking curve FWHM 1.7°-2.8°, bottom Pt (222) rocking curve FWHM 1.2°-1.8°, and a process which repeatably produced 001 oriented PZT with 001 Lotgering Factor~0.95. Top-electrode Pt (100) or $IrO_2$ was deposited on the PZT. The top Pt (100) had Pt (400) rocking curve FWHM 1.5°. Capacitor test devices were fabricated and ferroelectric properties obtained: ε33 500-860, tan δ 0.015, Pmax 25-40 μC/cm$^2$, and leakage current ~10 nA for 500 nm $SiO_2$ elastic layer, 450 nm PZT thickness, and 400 kV/cm electric field across the PZT.

X-ray diffraction was used to examine the crystallographic structure of the PZT thin films. X-ray diffraction (XRD) may be conducted on a Rigaku Ultima III Diffractometer with Bragg-Brentano Optics.

X-ray crystallography is a method of determining the arrangement of atoms within a crystal, in which a beam of X-rays strikes a crystal and causes the beam of light to spread into many specific directions. From the angles and intensities of these diffracted beams, a crystallographer can produce a three-dimensional picture of the density of electrons within the crystal. X-ray diffraction results in an x-ray beam scattered off the planes of a crystal which creates an interference pattern. To measure an interference maximum, the angle of incidence must be equal to the angle of reflection and the difference in the beam's path from a source to an observer for neighboring planes has to be equal to an integer multiple of the wavelength, the path difference being:

$$2d \sin(\theta) = m\lambda \text{ for } m=1, 2 \ldots$$

where d is the spacing between diffracting planes, θ is the incident angle, n is any integer, and λ is the wavelength of the beam. These specific directions appear as spots on the diffraction pattern called reflections. Thus, X-ray diffraction results from an electromagnetic wave (the X-ray) impinging on a regular array of scatterers (the repeating arrangement of atoms within the crystal). An x-ray diffraction scan is shown in, for example, FIG. 6 as a plot of scattering intensity vs. the scattering angle 2θ. The position of peaks appearing on the XRD scan is directly related to distance between crystal planes. The peak positions, intensities, widths and shapes all provide important information about the structure of the material. Integrated intensities of the diffraction peaks are used to reconstruct the electron density map within the unit cell in the crystal. Rocking curve measurements are made by doing a θ scan at a fixed 2θ angle, the width of which is proportional to the range of tilt of the individual crystallites in the film and is therefore used as a gauge of the quality of the film. Only crystallites having reflecting planes (h, k, l) parallel to the specimen surface will contribute to the reflected intensities. If the sample is truly random, each possible reflection from a given set of h, k, l planes will have an equal number of crystallites contributing to it. The sample may be rocked through the glancing angle theta in order to produce all possible reflections.

Evidence of the invention's effect is found where the structure and texture of the various film layers for the in-situ PZT sputter process are verified by x-ray diffraction (XRD) characterization, The following description is made with reference to XRD FIGS. 6-9 and 11-17.

For comparison purposes, FIG. 6 is an illustration showing an X-ray diffraction (XRD) scan for sputter PZT on Pt (100 nm)/$TiO_2$ (30 nm) on the Pt electrode. The $TiO_2$ Pt-template was obtained by ex-situ annealing the Ti (of thickness 20 nm) in the furnace at 750° C., 30 min, 3 SLM $O_2$.

Labelled in FIG. 6 as "Case I" test result, the 500 nm sputtered PZT deposited at 720° C. on Pt (without a $TiO_2$ seed layer) does not orient well and has low 001 PZT orientation with 101, 110, and 111 PZT peaks present. The 20 nm Ti(100) for the 30 nm $TiO_2$(100) rutile template (below Pt, for Pt growth) had an ex-situ furnace oxygen anneal and the Pt surface was exposed to air before PZT deposition.

Figure 7:
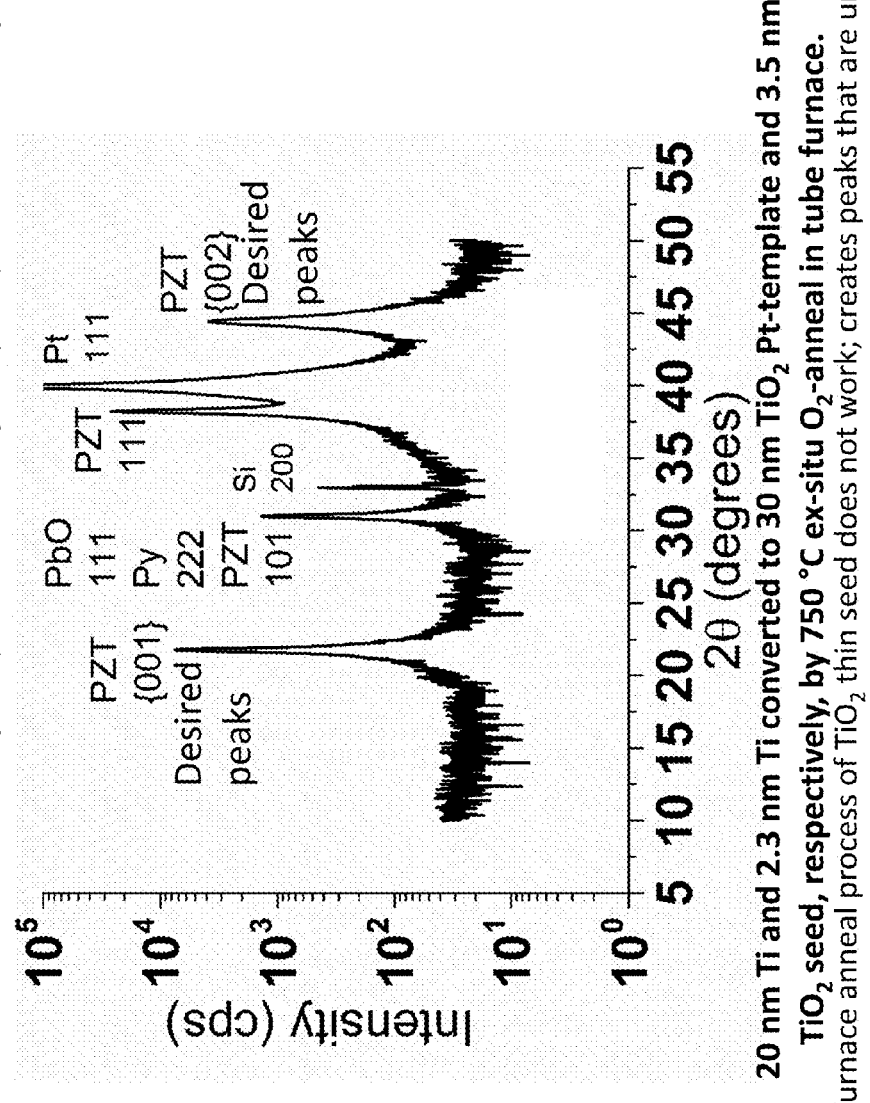
FIG. 7 is an illustration showing an x-ray diffraction (XRD) scan for sputter PZT on Pt (Pt (100 nm)/TiO$_2$ (30 nm) with 3.5 nm TiO$_2$ seed layer on the Pt electrode. The TiO$_2$ for templating the Pt and the seed layer were obtained by ex-situ annealing the Ti (of thickness 20 nm and 2 nm, respectively) in the furnace at 750° C., 30 min, 3 SLM O$_2$.

FIG. 7, also an X-ray diffraction scan, shows a second example (herein after Case II) test result, wherein 500 nm sputtered PZT deposited at 720° C. on Pt with $TiO_2$ seed layer which has an order of magnitude better PZT {001} orientation than in Case I (FIG. 6), but 101 and 111 PZT orientations persist. The 20 nm and 2.3 nm Ti(100) for the 30 nm and 3.5 nm TiO$_2$(100) rutile template (for Pt growth) and seed layer for PZT growth (on top of the Pt), respectively, had an ex-situ furnace anneal, and the Pt surface was exposed to air before PZT deposition.

FIG. 8, also an X-ray diffraction scan, shows a Case III test result, 500 nm sputtered PZT deposited at 720° C. on Pt without TiO$_2$ seed layer does not orient well, and has low 001 PZT orientation with 101 and 110 PZT, lead oxide, and pyrochlore (Py) peaks. The 20 nm Ti(100) for the 30 nm TiO$_2$(100) was oxidized in a lead oxide environment (PZT chamber). The Pt surface was exposed to the lead oxide environment of the PZT chamber.

FIG. 9, also an X-ray diffraction scan, shows Case IV test result, 500 nm sputtered PZT deposited at 720° C. on Pt with TiO$_2$ seed layer oxygen annealed in the PZT chamber. The PZT orients well, and has over two orders of magnitude better PZT {001} orientation than in Case I (FIG. 6) without the 101 and 111 PZT orientations found in Case II (FIG. 7). The 20 nm and 2 nm Ti(100) for the 30 nm and 3 nm TiO$_2$(100) rutile template (for Pt growth) and seed layer for PZT growth (on top of the Pt) were oxidized in a lead oxide environment (PZT chamber).

Taken together the results shown in FIGS. 6-9 demonstrate that the preferred method schematically shown in FIG. 3A, and in particular the in-situ process and the presence of the TiO$_2$ seed are crucial for the sputtering of strongly {001} oriented PZT and that exposure of the Pt surface to the lead oxide environment of the PZT chamber produces lead oxide phases and pyrochlore, whereas the exposure of the Ti seed to the lead oxide environment is consistent with strong {001} PZT orientation.

Process Parameters and Optimization.

FIG. 10 is the diagram of steps A-1 through A-5 for the preparation of Pt/TiO$_2$ test wafers processed with insitu or in-situ and ex-situ Ti oxidation in a lead oxide environment in accordance with a preferred method of the present invention. The steps A-1 through A-5 are delineated as:

STEP A-1—Wafers comprising a Si wafer with the SiO$_2$ (silicon dioxide) are prepared with titanium (Ti) (20 nm thick) is sputtered on top of the SiO$_2$/Si(100) wafers.

STEP A-2—Oxygen annealed (oxygen anneal matrix) to convert the 20 nm thick Ti into TiO$_2$ (titanium dioxide) with nominal thickness of 30 nm. The Ti in-situ anneal (I) exposes the sample to lead oxide vapor in the PZT sputtering chamber (620° C. or 720° C.).

STEP A-3—X-ray diffraction (XRD) analysis of the TiO2 is conducted (prior to Pt deposition).

STEP A-4—Platinum (Pt), 100 nanometers thick, is deposited (sputtered) on top of the TiO$_2$.

STEP A-5—XRD analysis of the Pt is conducted.

The conditions are given in the last line (750° C., 30 min, 3 standard liters per minute (SLM) oxygen flow). During the described testing, the tube furnace was a separate piece of equipment outside of the sputtering cluster tool.

As represented in FIG. 10, each of sample wafers 3, 6, 10, and 13 had a different set of conditions. These conditions are represented in the figures using the following terms. The "I" appearing in conjunction with the wafers represents "in situ", which is an anneal performed in the PZT chamber. The terminology I(620) or the I(720) indicates it was at either 620° C. or 720° C. in 10 sccm oxygen. The PZT chamber provides a lead oxide environment due to the heating of the chamber in the presence of a PZT (lead zirconate titanate) target. The term E represents ex-situ anneal in a tube furnace at the conditions given. After removal from the deposition system, Sample wafers 3 and 6 in FIG. 10, labeled (E) for "ex-situ" received an ex-situ furnace anneal at 750° C., 30 min, 3 standard liters per minute (SLM) O$_2$ flow. During the aforementioned testing, the tube furnace was a separate piece of equipment outside of the sputtering cluster tool, however, the furnace could have been integrated with the cluster tool in order to perform the furnace heating inside the clean environment of the cluster tool. Since seed layer thickness is only a few nanometers, too small to measure directly by XRD, these monitors provide XRD feedback about the impact of the oxygen anneal environment on both the 30 nm TiO$_2$ template (for sputtered Pt bottom-electrode growth) and the TiO$_2$ seed layer (on the Pt) for PZT growth. That feedback is the correlation of the XRD rocking curve FWHM (RC-FWHM) of the Pt with that of the TiO$_2$ beneath it (FIG. 11E).

FIG. 11A-E show oxidation & TiO$_2$—Pt correlation for test wafers 3, 6, 10, and 13 (represented in FIG. 10) with O$_2$ anneal at either 620° C. or 720° C., as described in the table in Graph 1 of FIG. 11A and in FIG. 10. FIGS. 11A-11D show that the X-ray diffraction (XRD) intensities of TiO$_2$ (200) and Pt (222) are strong for Sample wafers 3 and 13. FIG. 11E is a comparison of Pt (222) and TiO$_2$(200) RC-FWHM with in-situ anneals at temperatures shown and F designating subsequently furnace-annealed samples. Sample wafer 3 used a 620° C. in-situ anneal in the PZT chamber followed by the ex-situ furnace anneal (F) at 750° C., 30 min, 3 SLM O$_2$, whereas Sample 13 used a 720° C. in-situ anneal in the PZT chamber and no ex-situ anneal. The data point for 720° C., circled in red, indicates the operating point chosen for subsequent use in the in-situ process. Low RC-FWHM are preferred for the Pt (222) and TiO$_2$(200), but FIGS. 6-9 provide the case for abandoning the ex-situ anneal (620° C.+F) in favor of a completely in-situ process for sputter PZT.

FIGS. 12A though 12D illustrate X-ray diffraction (XRD) graphs 1-4 with 2θ scan ranges 10°-20°, 21°-22.8°, 28°-32°, and 33.4°-39° with 500 nm PZT grown on the 0-5 nm thick TiO$_2$ seed layer (sample wafers 228-233, respectively) on the Pt bottom electrode, the TiO$_2$ seed layer obtained by oxygen annealing sputtered Ti at 720° C. FIG. 12A shows that strong lead oxide peaks are present in the PZT for the case of no TiO$_2$ seed layer (Ti deposition time=0 s, Pt annealed in PZT chamber at 720° C., 1800 s). The optimum condition occurs at 3 s Ti deposition on the Pt surface oxidized in the PZT chamber at 720° C., 1800 s (3 nm TiO$_2$), with maximum PZT {001} orientation (FIG. 12B), minimum PZT 101 and 110 (FIG. 12C), and no PZT 111 (FIG. 12D).

Figure 13:
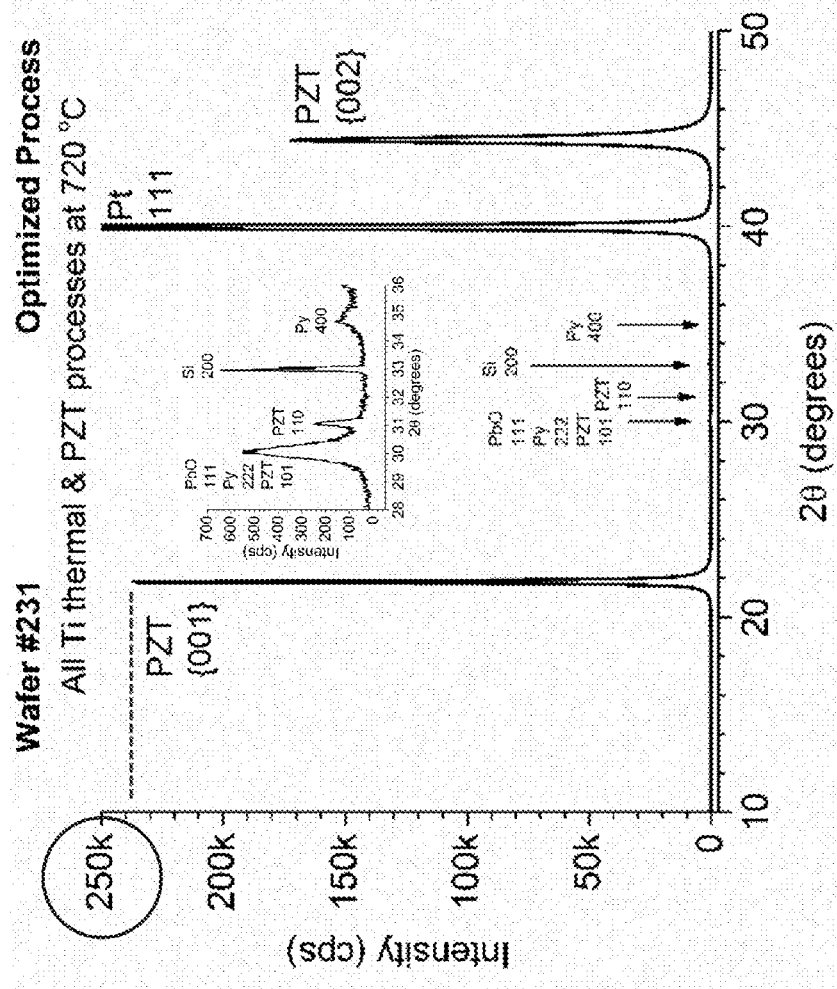
FIG. 13 is an illustration showing a linear plot of XRD scan from FIGS. 8 & 14. Lotgering Factor for PZT {001}=0.995. Inset figure is the rescaled XRD plot for 28°<2Θ<36°, showing the PbO(111)/PZT(101), PZT(110), and pyrochlore (Py) peaks with Intensity <500 cps.

FIG. 13 shows the XRD scan for Wafer 231 (optimum process with TiO$_2$ thickness equal to 3 nm) replotted with the intensity axis scaled linearly. In this case, the Lotgering Factor for the PZT {001} is 0.995. The inset figure expands the intensity scale in the 28°-36° 2θ-range, showing that the PbO(111)/Py(222)/PZT(101), PZT(110), and Py(400) peaks have intensity <500 cps (Py=pyrochlore).

Figure 14:
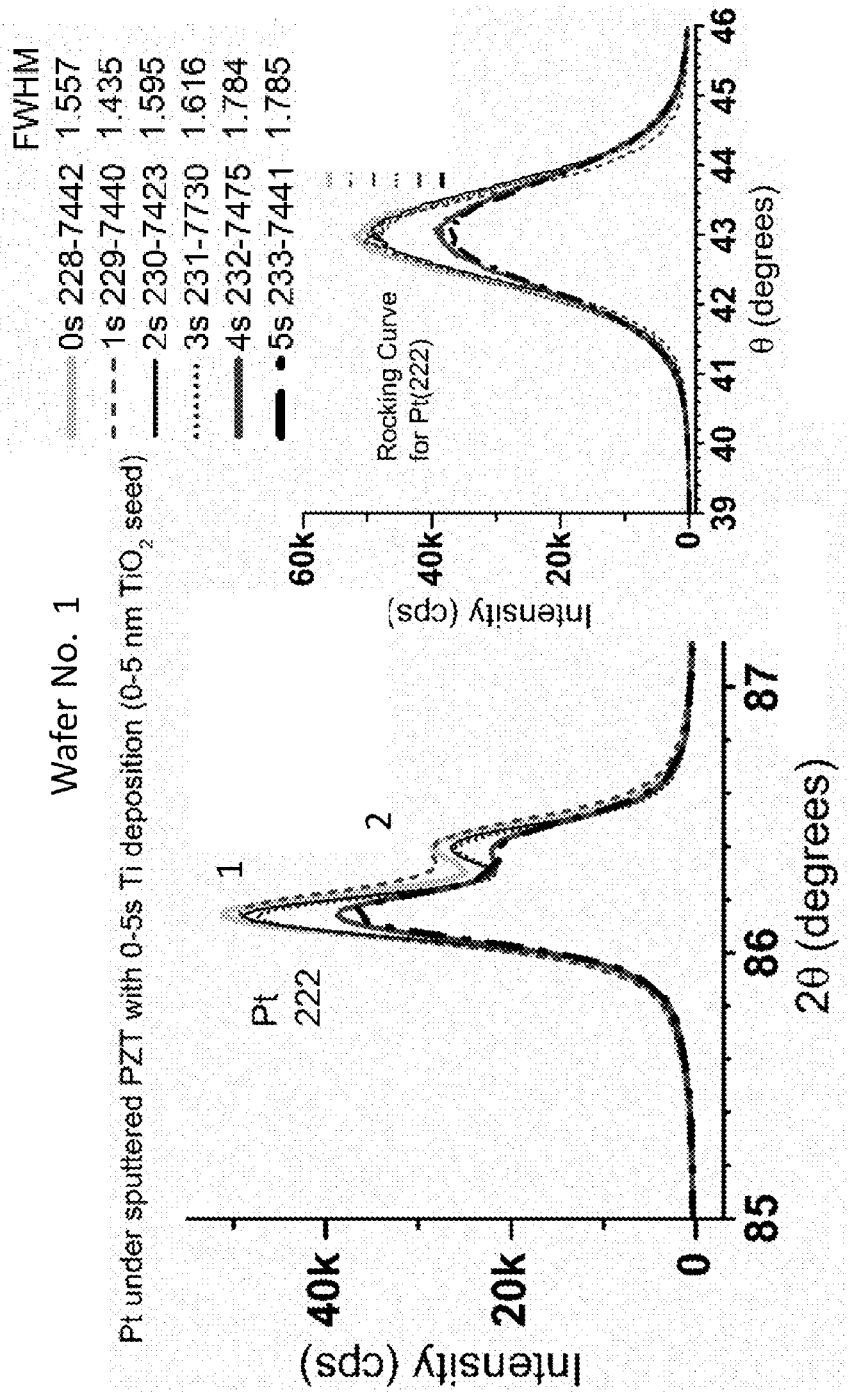
FIG. 14 is an illustration showing a Pt (222) XRD scan and rocking curve for the (bottom) Pt electrode measured through the PZT thickness (in-situ process) with the Ti seed layer deposition time varying from 0 to 5 seconds Pt (222) Cu-Kα1 (1) and Cu-Kα2 (2) peaks in the XRD scan are well resolved with the Pt (222) rocking-curve FWHM ranging from 1.4°-1.8°.

FIG. 14 illustrates a scan produced by X-ray diffraction (XRD) illustrating peak and rocking curve for bottom Pt (222) in the in-situ process measured through the 500 nm PZT deposited on top of it for wafers with varying Ti seed layers deposited from 0-5 s mentioned in the discussion of FIG. 12 above. Pt (222) Cu-Kα1 (1) and Cu-Kα2 (2) peaks in the XRD scan are well resolved with Pt (222) RC-FWHM ranging from 1.4°-1.8°.

Top PT with 100 Orientation on PZT {001}.

Figure 15:
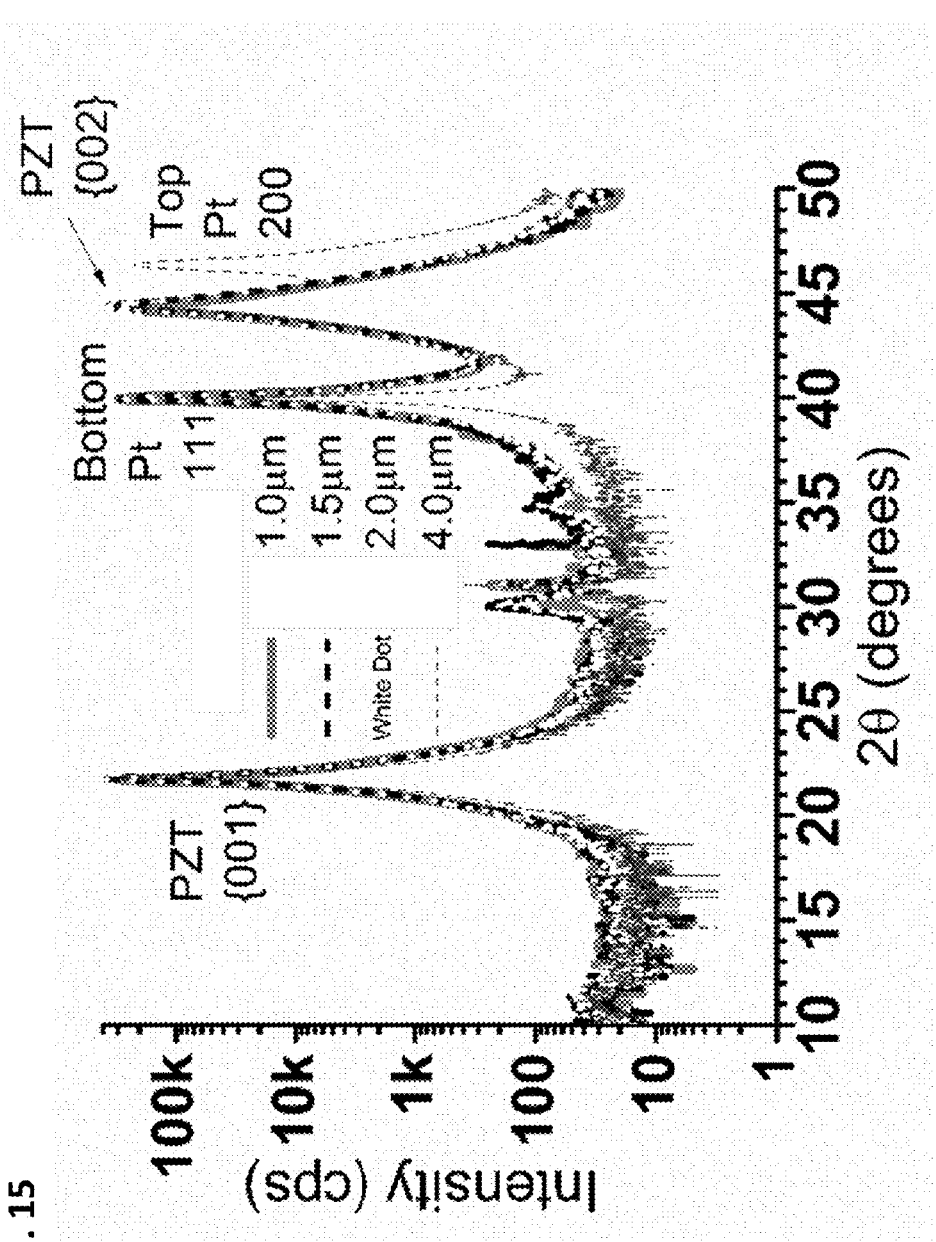
FIG. 15 is an XRD scan for 1-4 microns thick PZT. The PZT shows similar sample-to-sample peak heights as PZT thickness increases through 4 microns, maintaining strong {001} PZT orientation. Note, the wafer with 4.0 microns of PZT has a top Pt (Pt (200) peak showing that the top Pt is extremely well oriented in the 100 direction.

FIG. 15 shows the X-ray diffraction (XRD) scan for 4 micron thick Lead Ziconate Titanate (PZT). The PZT shows similar sample-to-sample peak heights as PZT thickness increases from 1 micron through 4 microns, maintaining strong {001} PZT orientation. The wafer with a 4 micron thick PZT layer has a top Pt electrode on top of the PZT and exhibits a Pt (200) peak, showing that the top Pt is oriented in the 100 direction.

Figure 16:
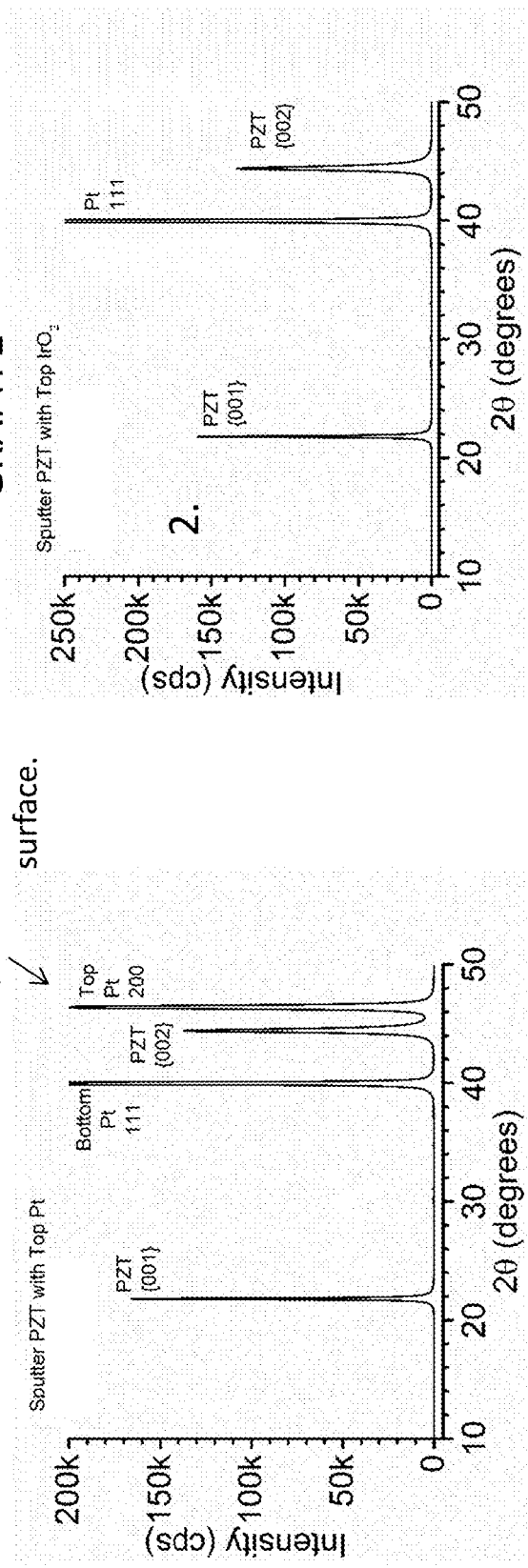
FIG. 16 is an illustration for PZT XRD data collected through Pt (Graph 1) & IrO$_2$ (Graph 2) top electrodes. Bottom electrode is Pt (111). For a Pt top electrode, the Pt 200 x-ray peak is clearly visible and illustrates that is highly textured with an x-ray count in excess of 175 kcps. In contrast, for an IrO$_2$ top electrode, whose 200 peak can overlap with Pt (111), illustrates no evidence of a Pt (Pt (200) peak. Therefore, the Pt (200) peak observed for the Pt top electrode coated substrates is fully attributable to the top Pt being textured from the underlying PZT and there is no Pt (200) contribution from the bottom Pt.

FIG. 16 illustrates Lead Ziconate Titanate (PZT) x-ray diffraction (XRD) scans collected through the top electrode for Pt and $IrO_2$ electrodes, Graphs 1 and 2, respectively. The bottom electrode is Pt (111). For Graph 1, the top electrode x-ray peak is Pt (200). For Graph 2, the top electrode is $IrO_2$ whose 200 peak is near Pt (111). Pt (200) is absent in the $IrO_2$ top-electrode case (Graph 2), showing that the Pt (200) peak for the Pt top-electrode case (Graph 1) is fully attributable to the top Pt. There is no Pt (200) contribution from the bottom Pt.

Figure 17:
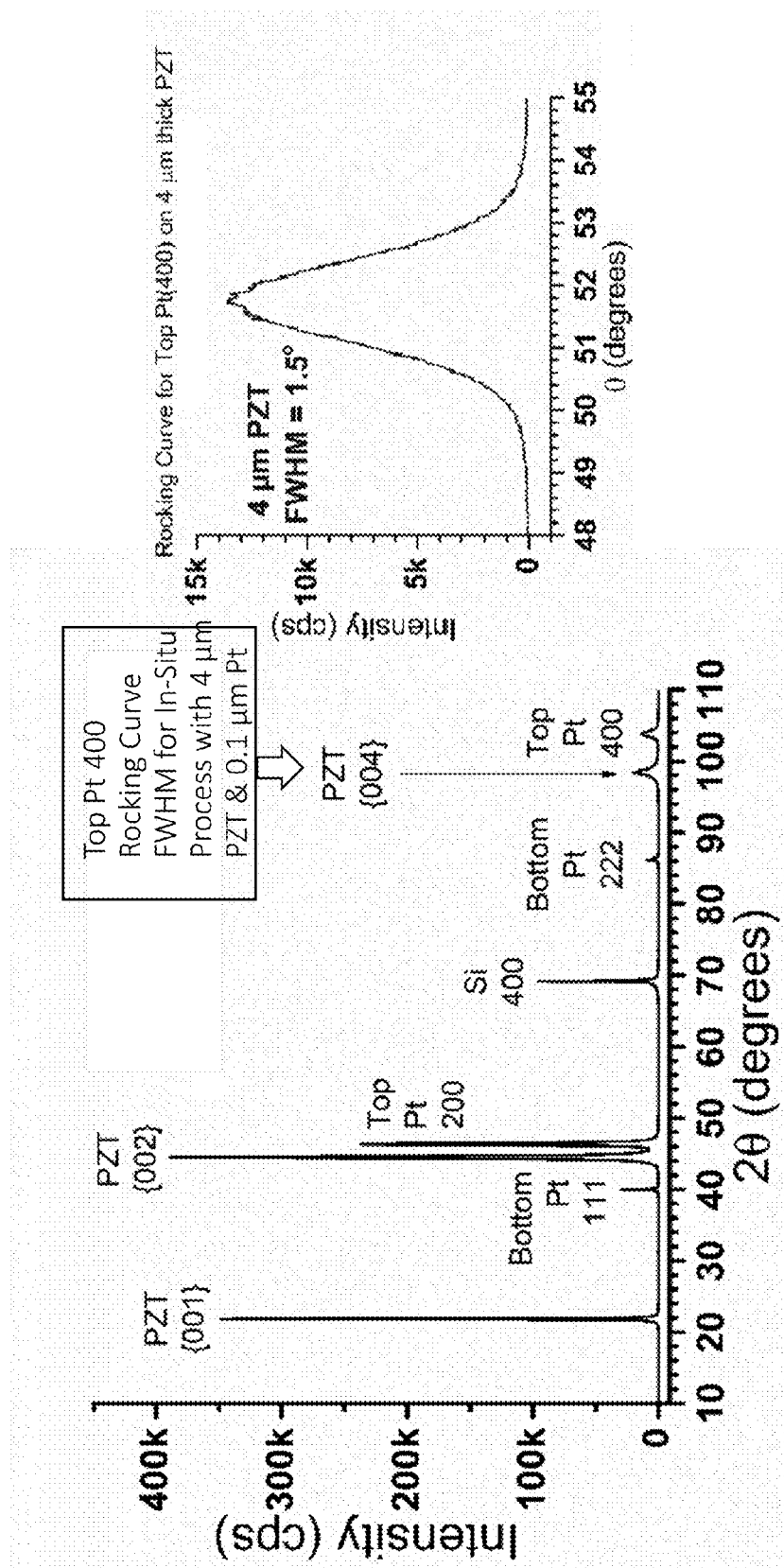
FIG. 17 is an illustration showing an extended XRD scan (10°-110°) for 4 microns thick PZT and top-Pt obtained with in-situ process. Rocking curve for the Pt (400) peak of the top Pt is in the plot to the right and has a FWHM of 1.5°.
Figure 23:
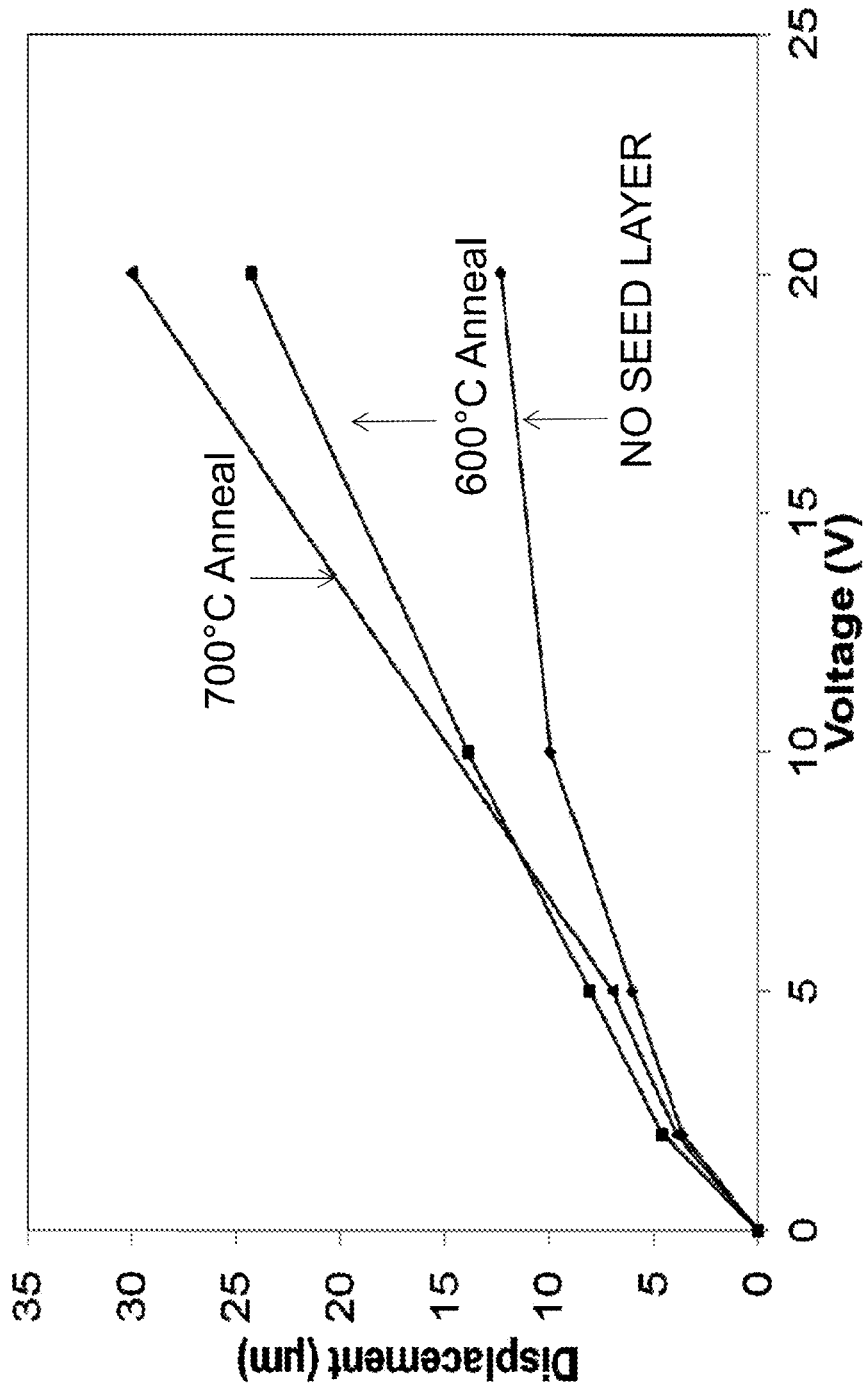
FIG. 23 is an illustration showing cantilever displacements at varying annealing temperature of seed layer.

FIG. 17 is an x-ray diffraction (XRD) scan for the 4 micron thick PZT with top Pt deposited over it. The 2θ measurement range is extended up to 110°, and shows the presence of both the Pt (200) and Pt (400) peaks at 2θ values of 48° and 104°, respectively, which provides quantitative evidence for the orientation and texture of the top Pt on the PZT. The inset graph shows the Pt (400) rocking curve with RC-FWHM=1.5°. A weak bottom Pt peak intensity is observed through the 4 micron thick PZT.

Morphology

FIG. 18 illustrates a plan-view SEM image of the sputtered PZT (720° C.) obtained using the in-situ process with $TiO_2$ seed layer. The PZT surface shows rectangular features with up to 100-200 nm edge length.

Stylo-Epitaxy

FIG. With reference to FIG. 24 shown therein is a 111 stylo-epitaxy electrode layer 14C as shown in FIG. 24. The left side correlates to the general case and is labeled 11C-18C and the specific case is labeled 11-18. The Pt falls into interstices of rutile structure as described further in U.S. Pat. No. 6,887,716, hereby incorporated by reference.

The stylo-epitaxial Pt electrode layer 14, approximately 10 nm to 300 nm thick, may be grown by sputter deposition or any other deposition technique that can result in stylo-epitaxial growth on the textured compound layer. Electrode materials include, but are not limited to Pt, Ir, Ru, Pd, Ni, Au, Cu, Ag. The stylo-epitaxial electrode layer 14C exhibits a volume fraction of crystallographically oriented grains >90% (approximately) and a stylo-epitaxial misalignment distribution FWHM of ≤7° (approximately). Examples of electrode stylo-epitaxial structures include, but are not limited to $(100)TiO_2$//(111)Pt, $(100)TiO_2$//Ir, (100)MgO//(100)Pt, (0001)AlN//(111)Pt.

With reference to FIG. 24, a first perovskite $ABO_3$ stylo-epitaxial layer 15C having a tetragonal distortion of >1.03 and with 0 to 50% (molar) excess A-site is deposited with a thickness of approximately 1 nm to 200 nm and consists of a volume fraction of oriented grains of >90% (approximately) and tilt distribution of oriented grains FWHM≤10 deg (approximately). The excess A-site is required in order to produce the stylo-epitaxial relationship with the underlying electrode 14C and the subsequent $ABO_3$ stylo-epitaxial layer 15C. Examples of this first $ABO_3$ stylo-epitaxial layer include, but are not limited to, $PbTiO_3$, $(PbLa)TiO_3$, $SrTiO_3$, $BaTiO_3$, $PbNiNbO_3$, $Pb(ZrTi)O_3$, $PbYbNbO_3$, $PbScTaO_3$. Illustrated in FIG. 24, layer 15C is a polycrystalline {001}-textured perovskite seed layer with RC-FWHM≤100 with c/a>1.03 (for example, $PbTiO_3$, etc.) and wherein the volume of {100}-textured grains is greater than 90%. The volume of {001}/({001}+{100})>80%. The thickness is 1 nm to 200 nm thick. Layer 15C comprises 0 to 50% (molar) A-site excess.

In the specific case of layer 15' comprising $PbTiO_3$, the $PbTiO_3$ may be deposited by sputter deposition, metalorganic solution spin-on, or other process, with pyrolysis at 450° C. and crystallization at 700° C. The $PbTiO_3$ layer 15' has perovskite structure with {100}-texture RC-FWHM≤10°. The volume of {100}-textured grains may be greater than 90%, and the volume of {001}/({001}+{100}) may be greater than 80%.

It is important to note that the A-site species of $ABO_3$ in this first perovskite stylo-epitaxial layer is predominantly the same as the A-site species in the subsequently deposited second perovskite layer. This first perovskite stylo-epitaxial layer can be deposited by any technique such as rf sputter deposition, spin-on chemical solution deposition, or MOCVD. The layer can be crystallized by a post deposition anneal or by depositing onto a heated substrate. Examples of stylo-epitaxial structures processed to this point include $(100)TiO_2$//(111)Pt//(001)$PbTiO_3$, $(100)TiO_2$//(111)Pt//(001)$PbNiNbO_3$.

As depicted in FIG. 24, a second approximately 30 nm to 10 um thick perovskite $ABO_3$ stylo-epitaxial layer 17C that has the desired ferroelectric and piezoelectric properties is deposited. This second perovskite stylo-epitaxial layer has a surface lattice match within 25%, 0 to 15% (molar) excess A-site and consists of a volume fraction of oriented grains of greater than 90% (approximately) and tilt distribution of oriented grains FWHM≤100 (approximately). The polycrystalline perovskite ferroelectric may be for example, PZT, PMN-PT etc., and the perovskite ferroelectric {100}-textured with RC-FWHM≤10° with the volume of {100}-textured grains being >90%. The volume of {001}/({001}+{100}) is greater than 80%. Examples of this second $ABO_3$ stylo-epitaxial layer include, but are not limited to, (BaSr)$TiO_3$, $Pb(MgNb)O_3$, $PbNiNbO_3$, $Pb(ZrTi)O_3$ (PZT), $PbYbNbO_3$. This second perovskite stylo-epitaxial layer 17C can be deposited by any technique such as RF sputter deposition, spin-on chemical solution deposition, or MOCVD. The layer 17C can be crystallized by a post deposition anneal or by depositing onto a heated substrate. The following conditions are recommended for layer 18 (PZT): Pyrolysis at 450° C.; Crystallization at 700° C.; PZT has perovskite structure with {100}-texture RC-FWHM≤10°. volume of {100}-textured grains >90%.

Examples of stylo-epitaxial structures processed to this point include $(100)TiO_2$//(111)Pt//(001)$PbTiO_3$//(001)$PbZr_{0.52}Ti_{0.45}O_3$, $(100)TiO_2$//(111)Pt//(111)$PbZr_{0.4}Ti_{0.6}O_3$. It should be noted that the first perovskite stylo-epitaxial layer $PbTiO_3$ 15' is a distinct layer and is not included in the second structure resulting in a (111)PZT stylo-epitaxial structure 17. It can be seen that the stylo-epitaxial approach can be extended to a range of perovskite orientations and can also be extended to include crystal structures other than perovskite. At this point the combination of homo- and hetero-epitaxial layers make a complete chain of epitaxial layers within each grain, but each columnar grain has an undefined rotation about axes normal to the epitaxial plane.

The structure (which may be, for example, a capacitor) preferably has an approximately 10 nm to 300 nm thick top electrode 18, 18C. It is preferred that the top electrode is a stylo-epitaxial layer. If the top electrode is formed as a stylo-epitaxial layer, the epitaxial relationship to the PZT depends on the termination of the PZT layer 17. With Ti/O-termination, one epitaxial relationship is (001)PZT//(100)Pt. Top stylo-epitaxial electrode materials include, but are not limited to Pt, Ir, Ru, Pd, Ni, Au, Cu, Ag, $IrO_2$, $RuO_2$, $LaSrCoO_3$, $SrRuO_3$, $LaNiO_3$, $InSnO_2$. The stylo-epitaxial electrode layer 18C exhibits a volume fraction of crystallographically oriented grains >90% (approximately) and a stylo-epitaxial misalignment distribution FWHM of ≤10° (approximately). Examples of stylo-epitaxial structures processed to this point include (100)TiO$_2$//(111)Pt//(001)PbTiO$_3$//(001)PbZr$_{0.52}$Ti$_{0.48}$O$_3$//(100)Pt.

The stylo-epitaxial structure can be extended to include any combination of layers or repeat units and can further be extended to include a barrier layer that encapsulates the ferroelectric/piezoelectric stylo-epitaxial capacitor structure 14C-18C.

Electrical Properties of the PZT

Electrical ferroelectric property measurements on fabricated capacitor devices verified performance of the PZT deposited using the in-situ process to be comparable to that of state-of-the-art CSD PZT. The top table in FIG. 19 shows the substrate temperature (T in ° C.), thermal SiO$_2$ elastic layer of 500 nm thickness, PZT thickness (450 nm), top electrode type, and PZT texture (Lotgering Factor) in percent. For IrO$_2$ and Pt top electrodes, the bottom table shows the maximum polarization ($P_{max}$=25-40 µC/cm$^2$), remnant polarization ($P_{rem}$ in µC/cm$^2$), and leakage current (~10 nA) for 400 kV/cm electric field across the PZT, and dielectric constant ($\varepsilon_{33}$=500-860), and loss tangent (tan δ=0.015) at 10 kHz, 0.5V. The values of these quantities for a typical CSD PZT layer are shown in the bottom row of each table.

This in-situ process provides textured PZT. The TiO$_2$ layer 13 and the TiO$_2$ seed layer 15 are protected from exposure to air and its contaminating influence to provide high quality templates for growth of the bottom Pt layer 12 and the PZT seed 16, respectively. In addition, the Pt 222 bottom electrode 14 is more highly textured, and the top Pt electrode 18 is 100 oriented, acting as a superior template for successive layers of PZT in stacked PZT-electrode multilayer devices in FIG. 20.

By using in-situ substrate heating in the PZT chamber for the Ti oxidations of layers 13 and 15 and for the PZT deposition, keeping the wafer in the sputter tool (or some similar enclosure) for the entire processing, improved growth occurs (FIGS. 9, 12A-D, and 13). In particular, the TiO$_2$ layer 13 and TiO$_2$ seed layer 15 are protected from exposure to air and its contaminating influence to provide high quality templates for growth of bottom Pt and PZT, respectively. In addition, the Pt 222 bottom electrode is more highly textured, with optimized PZT occurring for PZT with 3 nm thick TiO$_2$ seed layer (see FIG. 14).

The evidence of the stronger bottom Pt orientation is the unprecedented CuKa1 CuKa2 splitting in the Pt (Pt (222) XRD peak and smaller Pt (Pt (222) RC-FWHM shown in FIG. 14. The strong {001} PZT orientation this bottom Pt produces in conjunction with the clean TiO$_2$ seed layer produced on bottom Pt (Pt (222) is quantified by a Lotgering Factor of 0.995. The clean surfaces on which each successive layer grows are high quality templates for growth of successive layers. The top Pt electrode 18 is templated on the PZT to be 100 oriented, and although Pt (111) is an acceptable orientation to act as template for PZT growth, Pt (Pt (100) provides a better template for depositing PZT in the (preferred) 001 orientation. This alternate stacking of electrodes and PZT in FIG. 20 can serve as a superior set of process steps for successive layers of PZT in stacked PZT-electrode multilayer devices.

C. The preferred method of the present invention eliminates chemical solution deposition (CSD) lead titanate (PTO) seed layer and chemical solution deposited (CSD) PZT When it is desired to deposit PZT layers up to 4 microns thick, a sputtering process is much faster than CSD, typically hours for sputtering compared to days for CSD. Short processing times are important for devices such as gyroscopes that typically require PZT films with a thickness in excess of 2 um.

Prior TiO$_2$ seed layers 15 could not provide an adequate template for orienting sputtered PZT, often containing an undesired PZT orientation (101, 110), pyrochlore (Py), and potentially other (lead oxide) phases. A soft plasma clean was attempted in order to improve the surfaces, but did not work. Also, for early attempts at optimizing the seed layer with oxidation in either the external tube furnace or the PZT sputter chamber, the wafers used for sputter deposition were put into the chamber and removed several times, including loading the wafer before Ti deposition for layer 13 and removing it afterwards to do the furnace anneal for conversion of the Ti to TiO$_2$, then reloading into the sputter system to deposit the Pt layer 14, then removing the wafer and reloading it into the sputter system to perform the Ti deposition for layer 15, removal to furnace oxidize the Ti to create the TiO$_2$ seed layer 15, then reloading to the sputter chamber to do the PZT sputter deposition and subsequent top-Pt electrode deposition. All this unloading and reloading of process wafers from/into the sputter system exposed thin film surfaces to air, contaminating the layer interfaces. The in-situ process eliminates this problem by processing Layers 13-18 without removal of the wafer from the sputter system, only exposing the wafer to research grade process gases Ar and O$_2$ and system vacuum.

An approximately 30 nm to 10 um PbZr$_{1-x}$Ti$_x$O$_3$ stylo-epitaxy layer with x=0.40 to 0.60 and with a PbO excess of 0 to 15% is deposited onto the PbTiO$_3$ layer and consists of a volume fraction of {001}-oriented grains of >90% (approximately) and tilt distribution of the {001}-oriented grains of FWHM ≤10° (approximately). The epitaxial relationship is (001)PbTiO$_3$//(001)PZT provided that the strain provides a good match of the PbTiO$_3$ and PZT lattices. If the lattice mismatch is too large, a fraction of the PZT grains will produce a (001)PbTiO$_3$//(100)PZT epitaxial relationship in order to reduce the strain energy of the structure. At this point in the structure, there are now 4 or 5 stylo-epitaxial layers, depending on complete or incomplete Ti oxidation, respectively, comprising each grain of the structure. The combination of homo- and hetero-epitaxial layers make a complete chain of epitaxial layers within each grain, but each columnar grain has an undefined rotation about axes normal to the epitaxial plane. (This analysis can be extended to the tetragonal/rhombohedral case.)

It is believed that Fuji may have presented results for PZT orientation and similar electrical behavior obtained by another processing means: sputtering Nb-doped PZT to improve orientation and imprint. It appears that Fuji uses a seed layer, but it is metal, typically Pt or Ir(111), and it's main function appears to be, as stated in the U.S. Pat. No. 8,164,234, for adhesion.

Potential Uses

The present invention may be used for PiezoMEMS cantilevers and capacitors for actuators, sensors, filters, resonators, and switches for radio, radar, microwave, position and navigation, ink jet printing, and robotics.

Possible future uses of the preferred embodiments of the invention include energy harvesting, innovative RF MEMS devices for future high performance RF-systems, energy efficient mobile communication systems, highly miniaturized and integrated RF components, cost efficient solutions to the mobile phone industry, phase shifter, switch, resonator component for radar, microbotics, components for microflight, terrestrial robotics, micro-motors. Thick PZT can be used in (1) actuators for ink-jet printer heads and (2) inertial sensors for Position Navigation & Timing (PNT). The high deposition rate for PZT deposited by sputtering is important for applications such as PNT which require relatively large PZT layer thicknesses (1-4 microns in minutes). Prior and current processing by CSD is not a practical route toward thick PZT due to slow processing times (days).

Results and Discussion—PbTiO$_3$ Tests Using a Ti/Pt or TiO$_2$/Pt Bottom Electrode Sputtered PbZr$_{0.52}$Ti$_{0.48}$O$_3$(PZT) processing, compared to chemical solution deposition (CSD), has the potential to increase process throughput for piezoelectric MEMS device fabrication. Using an Oerlikon Clusterline 200 cluster tool configured with a RF (radio frequency) chamber and integrated hot chuck capable of 800° C. operation, PZT was sputtered using a ceramic target with 10% excess Pb. Prior to PZT deposition, the Pt bottom electrode surface was prepared by creating a ~3 nm TiO$_2$ seed layer. An integrated hot chuck is attached to the bottom of the substrate holder in the PM 6 position of the cluster tool in FIG. 4. The main difference between this hot chuck and heaters in other PMs is its capability to provide substrate temperatures up to 800° C. Generally, the temperature is lower than 750° C. for the preferred embodiment PZT sputter processing. It is integrated in the sense that it provides heat to a substrate loaded into the PM wafer chuck, using computer control to set the temperature manually on the computer interface and maintain it during sputter processing.

As used herein, ambient conditions in PM 6 are in the 600-750° C. temperature range.

As used herein, XRD=x-ray diffraction, for example "in order to monitor the XRD signal for TiO$_2$ by XRD". FWHM=full width half maximum. The FWHM measured is that of the rocking curve and is a measure of the texture of the material being analyzed. For a strong sharp peak, there will be a high intensity and a very sharp (small) rocking curve FWHM. The smaller the rocking curve FWHM and the higher the intensity of the peak, the more textured the material is.

Capacitor measurements of ferroelectric properties for the Pt-PZT-Pt test capacitor (e33=the capacitor dielectric constant=500-680, tan delta is the loss tangent=0.015, Pmax is the maximum polarization of the ferroelectric hysteresis loop=25-40 micro-coulombs per centimeter squared, leakage current is the undesirable current loss across the test capacitor device ~10 nanoamps). The PZT in the test capacitor is 450-500 nanometers thick. The electric field applied across the capacitor during the test measurements is 0-400 kilo-Volts per centimeter, but the field is applied to obtain a full hysteresis loop. So, 0-400, 400-0, 0 to −400, −400 to 0, and 0-400. The significance of these results is that they compare favorably with those for PZT that was obtained by the chemical solution deposition (CSD) process.

As used herein, PTO means lead titanate (PbTiO$_3$), an abbreviation that is often used in technical discussions & technical literature.

Indices used herein relate to Miller indices that are used in accordance with a crystallography notation system for planes and directions in crystal (Bravais) lattices. A family of lattice planes is determined by three integers h, k, and l (the Miller indices). They are written (hkl), and each index denotes a plane orthogonal to a direction (h, k, l) in the basis of the reciprocal lattice vectors. By convention, negative integers are written with a bar, as in $\bar{3}$ for −3. The integers are usually written in lowest terms, i.e. their greatest common divisor should be 1. Miller index 100 represents a plane orthogonal to direction h; index 010 represents a plane orthogonal to direction k, and index 001 represents a plane orthogonal to l. There are also several related notations: the notation {hkl} denotes the set of all planes that are equivalent to (hkl) by the symmetry of the lattice. In the context of crystal directions (not planes), the corresponding notations are [hkl], with square instead of round brackets, which denotes a direction in the basis of the direct lattice vectors instead of the reciprocal lattice; and similarly, the notation ⟨hkl⟩ denotes the set of all directions that are equivalent to [hkl] by symmetry. Further information can be obtained in Wikipedia.

As used herein the "100 orientation" refers to the atomic arrangement of atoms as shown in FIG. 2. Films at the MPB (PZT (52/48)) with (001)-orientation show the most improvement in piezoelectric properties, which is the preferred PZT for the PZT mentioned throughout this application.

As used herein the "111 orientation" refers to the atomic arrangement of atoms as shown in FIG. 2.

As used herein the terminology "register" in relation to a crystallographic structure means, with respect to two adjacent granular layers, the grains in a first granular layer are in registration with and contacting grains in the adjacent layer. For example, in a preferred embodiment, each ferroelectric grain is in registration with one electrode grain.

The terminology perovskite structure is any material with the same type of crystal structure as calcium titanium oxide (CaTiO$_3$), known as the perovskite structure, or XIIA2+VIB4+X2−3 with the oxygen in the face centers. The general chemical formula for perovskite compounds is ABX$_3$, where 'A' and 'B' are two cations of very different sizes, and X is an anion that bonds to both. The 'A' atoms are larger than the 'B' atoms. The ideal cubic-symmetry structure has the B cation in 6-fold coordination, surrounded by an octahedron of anions, and the A cation in 12-fold cuboctahedral coordination. The relative ion size requirements for stability of the cubic structure are quite stringent, so slight buckling and distortion can produce several lower-symmetry distorted versions, in which the coordination numbers of A cations, B cations or both are reduced.

As used herein, Piezoelectric coefficient or Piezoelectric Modulus, also known as d$_{33}$, quantifies the volume change when a piezoelectric material is subject to an electric field, or the polarization on application of a stress:

$$d = \frac{P}{\sigma}$$

where P is polarization, and σ is the stress.

As used herein, texture measurements refer to measurements used to determine the orientation distribution of crystalline grains in a polycrystalline sample. A material is termed textured if the grains are aligned in a preferred orientation along certain lattice planes.

As used herein epitaxy refers to the deposition of a crystalline overlayer on a crystalline substrate, where the overlayer is in registry with the substrate at a preferred orientation of the overlayer with respect to the substrate for epitaxial growth. The overlayer is called an epitaxial film or epitaxial layer. Epitaxial deposition of a layer on a substrate matches the crystalline order of the substrate.

As used herein the terminology "growth plane" refers to the epitaxial growth planes. Growth planes and their crystallographic axes may be expressed as, for example, [112] (111) X//[1100](0001) Y, where X and Y are crystal materials and the (111) and (0001) are faces and the brackets [ ]

indicate crystallographic axes. For example, the perovskite crystal orientation having a {001} orientation means that the {001} planes of the perovskite crystal lie parallel to the growth plane.

As used herein, the term "stylo" means, in combination with epitaxy, "column," "pillar," "tube," or column-like crystal growth as shown for example in FIGS. 6A and 6B of application Ser. No. 14/219,028entitled "Stylo-Epitaxial Piezoelectric and Ferroelectric Devices and Method of Manufacturing," filed Mar. 19, 2014, hereby incorporated by reference As used herein the word "textured" or "textured layer" means a formation of a layer such that the orientation of the grains in the growth direction may be slightly misaligned relative to each other as compared to a single crystal in which the structure is completely aligned along the growth direction. For example, the grains in a textured layer are crystal-like and qualitatively have the same orientation in the direction of growth but may be off by typically up to a degree or two.

As used herein the terms columns or column-like structures refer to the column-like structures grown on top of granular regions. The column-like structures and granular regions are substantially coextensive.

As used herein the terminology thin film is a layer of material ranging from fractions of a nanometer (monolayer) to several micrometers in thickness.

As used herein the terminology "rutile" refers to a mineral composed primarily of the preferred polymorph of titanium dioxide, $TiO_2$. Rutile is the most common natural form of $TiO_2$.

As used herein the terminology "perovskite" means the crystal structure, as depicted in FIG. 2, of any material with the same or substantially the same type of crystal structure as calcium titanium oxide ($CaTiO_3$), known as the perovskite structure.

As used herein, the expression full width at half maximum (FWHM) is an expression of the extent of a function, given by the difference between the two extreme values of the independent variable at which the dependent variable is equal to half of its maximum value.

As used herein the terminology "crystallites" refer to small, microscopic crystals that, held together through highly defective boundaries, constitute a polycrystalline solid. Crystallites are also referred to as grains.

As used herein, the terminology "chamber" means, enclosure, container, sealed container, containment system, or area sealed off by a barrier; and in the case of at least one preferred embodiment, no exposure of the wafer to an environment containing undesired gases and/or particles from the time of the initial loading of wafer with thermal-$SiO_2$ film on Si to the final top electrode deposition; preferably allowing wafer exposure only to purified Ar or $O_2$ flow or vacuum. Alternately, a container could be used to transfer the wafer between chambers, The terminology in situ processing is also used to designate no exposure of the wafer to an environment containing undesired gases and/or particles from the time of the initial loading of wafer with thermal-$SiO_2$ film on Si to the final top electrode deposition. This may be accomplished in one chamber or a series of chambers.

The foregoing description of the specific embodiments are intended to reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A method of making a piezoelectric device comprising:
providing at least one deposition chamber, the at least one deposition chamber having reduced pressure therein;
loading a substrate into the at least one deposition chamber;
sputter depositing hexagonal 001 oriented titanium on the substrate;
providing an oxygen anneal to convert the 001 oriented titanium into 100 oriented rutile $TiO_2$;
sputter depositing a 111 or 100 oriented textured conducting material layer to form a film for use as an electrode;
sputter depositing a hexagonal 001 oriented titanium layer and providing an oxygen anneal in a lead oxide environment to convert the 001 oriented titanium into 100 oriented rutile $TiO_2$ or perovskite $PbTiO_3$,
sputter depositing textured lead zirconate titanate Pb $Zr_xTi_{1-x}O_3$ (where x ranges from 0.40 to 0.60) having an 001 orientation as a piezoelectric layer, and
sputter depositing a textured electrode layer on top of the textured lead zirconate titanate;
whereby processing of the layers within the at least one deposition chamber provides minimized exposure to ambient contamination and improved texturing in the film.

2. A method of making a piezoelectric device comprising:
providing a sealed container, the sealed container having reduced pressure therein;
loading a substrate into the sealed container;
coating the substrate with an amorphous coating;
growing a crystalline textured layer on the amorphous coating;
sputter depositing a 111 or 100 oriented textured conducting layer for use as an electrode;
sputter depositing hexagonal 001 oriented Ti and converting it to a 100 oriented $TiO_2$ seed textured layer;
sputter depositing of textured lead zirconate titanate having an 001 orientation; and
sputter depositing an electrode on top of the textured lead zirconate titanate;
to form a film;
whereby in-situ processing of the crystalline textured, 111 or 100 oriented textured conducting, and 100 oriented $TiO_2$ seed textured layers provides minimized exposure to ambient contamination and improved texturing in the film.

3. The method of claim 2 wherein the growing of a crystalline textured layer on the amorphous coating results in granular regions; and wherein the textured lead zirconate titanate is sputter deposited on the $TiO_2$ seed textured layer; the $TiO_2$ seed textured layer comprising a Ti layer converted to $TiO_2$ with an anneal in excess of 500° C. within an oxygen environment with a partial pressure of lead oxide.

4. The method of claim 2 wherein the sealed container is a sealed vacuum deposition chamber containing one or more of lead oxide, argon or oxygen and wherein the chamber interior has a base pressure less than $10^{-3}$ torr.

5. The method of claim 2 wherein the sputter depositing comprises DC magnetron sputtering or pulsed DC magnetron sputtering for the titanium and platinum layers and RF magnetron sputtering for the lead zirconate titanate.

6. The method of claim 2 wherein the crystalline textured layer is formed from one of the group of $TiO_2$, $SnO_2$, MgO, CaO, SrO, FeO, ZnO, NiO, CeO, CoO, TiN, AlN, CrN, BN, GaN, and $CaF_2$.

7. The method of claim 2 wherein the crystalline textured layer is approximately 1 nm to 300 nm thick and wherein the crystalline textured layer is the result of an oxidation anneal and forms a rutile structure which facilitates the formation of a granular structure and wherein the first electrode layer has a thickness in the range of 10 to 500 nm, and is formed by sputter depositing an epitaxial layer, and wherein the electrode layer material comprises one or more of Pt, Ir, Ru, Pd, Au, Ag, and Cu.

8. The method of claim 2 wherein the crystalline textured layer comprises a polycrystalline {001}-textured perovskite seed with RC-FWHM <10° and a thickness in the range of 1-200 nm, preferably 20-50 nm and wherein the and wherein the volume of {100}-textured grains is greater than 90% and the volume of {001}/({001}+{100})>80%.

9. The method of claim 2 wherein the crystalline seed layer comprises one of $(PbLa)TiO_3$, $SrTiO_3$, $BaTiO_3$, $PbNiNbO_3$, $Pb(ZrTi)O_3$, $PbYbNbO_3$, $PbScTaO_3$, or $PbTiO_3$.

10. The method of claim 2 wherein the step of growing a crystalline textured layer on the amorphous coating comprises sputter depositing hexagonal 001 oriented titanium on the substrate; and wherein the method further comprises providing an oxygen anneal to convert the 001 oriented titanium into 100 oriented rutile $TiO_2$; and further comprising the step of sputter depositing a hexagonal 001 oriented titanium onto the 100 oriented $TiO_2$ seed textured layer and providing an oxygen anneal in a lead oxide environment to convert the 001 oriented titanium into 100 oriented rutile $TiO_2$ or perovskite $PbTiO_3$ and wherein the sealed container is at least one deposition chamber and wherein processing of the layers within the at least one deposition chamber provides minimized exposure to ambient contamination and improved texturing in the resulting films.

11. The method of claim 10 wherein the 111 or 100 textured conducting material is 111 textured platinum which is deposited on the 100-oriented rutile $TiO_2$, and wherein the textured lead zirconate titanate layer is sputter deposited on the 100 oriented rutile $TiO_2$ or perovskite $PbTiO_3$.

12. The method of claim 10 wherein the sealed container comprises a singular deposition chamber and wherein the oxygen anneal of the hexagonal 001 oriented titanium is conducted in the deposition chamber at a temperature in the range of 500-800° C. with a partial pressure of lead oxide to incorporate lead or lead oxide into the converted 100 oriented rutile $TiO_2$ or perovskite $PbTiO_3$.

13. The method of claim 10 wherein the at least one deposition chamber is a sealed vacuum deposition chamber containing one or more of lead oxide, argon or oxygen and wherein the deposition chamber interior has a base pressure of less than $10^{-3}$ torr.

14. The method of claim 10 wherein the at least one deposition chamber comprises a series of deposition chambers forming a sealed in-situ containment system comprising a plurality of process modules and a connecting vacuum transfer chamber for substrate load-unload into and out of wafer boats and transfer between chambers; and wherein there is no exposure of the substrate to an environment containing undesirable gases and/or particles from the time of the substrate is loaded to the textured electrode deposition on top of the textured lead zirconate titanate preferably allowing substrate exposure only to purified Ar or $O_2$ flow or vacuum.

15. The method of claim 2 further comprising the step of sputter depositing a hexagonal 001 oriented titanium onto the 100 oriented $TiO_2$ seed textured layer and providing an oxygen anneal in a lead oxide environment to convert the 001 oriented titanium into 100 oriented rutile $TiO_2$ or perovskite $PbTiO_3$; and wherein the substrate remains in the sealed container between and during the sputtering processes, and wherein 111 or 100 textured conducting material is 111 platinum; and wherein the sputter processing of the 111 textured platinum, oriented rutile $TiO_2$ or perovskite $PbTiO_3$, and the textured lead zirconate titanate $PbZr_xTi_{1-x}O_3$ within the sealed container minimizes exposure to ambient contamination and improves texturing.

16. The method of claim 2 wherein the sealed container comprises at least one deposition chamber and wherein sputter depositing of 001 oriented titanium onto the substrate, the sputter depositing of the 111 or 100 oriented textured conducting material, the sputter depositing of textured lead zirconate titanate, and the sputter depositing of the electrode on top of the textured lead zirconate titanate are conducted in the at least one deposition chamber without removal of the substrate from the sealed at least one deposition chamber and without allowing ambient air into the at least one sealed deposition chamber to thereby improve texturing and minimize exposure to ambient contamination.

17. The method of claim 2 wherein the $TiO_2$ seed textured layer, the textured lead zirconate titanate, and the electrode thereon are in registration with the preceding layer and wherein the sealed container is a sealed vacuum deposition chamber containing one or more of lead oxide, argon or oxygen and wherein the chamber interior has a base pressure less than $10^{-3}$ torr.

18. The method of claim 2 wherein the substrate remains in the sealed container continuously between and during all of the sputtering depositions and wherein the sputter depositing of a textured lead zirconate titanate layer comprises bombarding a lead zirconate titanate target positioned above the substrate with atoms such that the lead zirconate titanate falls from the lead zirconate titanate target and forms on the 100 oriented rutile $TiO_2$ or perovskite $PbTiO_3$.

19. The method of claim 2 wherein the step of sputter depositing an electrode on top of the textured lead zirconate titanate comprises sputter depositing an electrode having a thickness in the range of approximately 10 nm to 500 nm and wherein the electrode comprises one or more of Pt, Ir, Ru, Pd, Ni, Au, Cu, Ag, $IrO_2$, $RuO_2$, $LaSrCoO_3$, $SrRuO_3$, $LaNiO_3$, and $InSnO_2$.

20. The method of claim 2 wherein the step of sputter depositing of textured lead zirconate titanate comprises maintaining the crystal planes within column-like structure of the lead zirconate titanate substantially parallel to the growth plane to provide optimum spontaneous polarization perpendicular to the growth plane and wherein the granular regions of the seed layer, lead zirconate titanate and first electrode are in registration such that the columns in the lead zirconate titanate extend from the granular regions of the seed layer, and the granular regions of the seed layer extend from the granular regions of first electrode, and wherein the crystallographic planes within the granular regions and the column-like structures are substantially planar to the growth plane with a tilt of less than or equal to approximately 10 degrees from the growth plane, and wherein the crystal orientation within the lead zirconate titanate is predominately {001}.

21. The method of claim 1 wherein said sputter depositing hexagonal 001 oriented titanium on the substrate;
- said providing oxygen anneal to convert the 001 oriented titanium into 100 oriented rutile $TiO_2$;
- said sputter depositing the 111 or 100 oriented textured conducting material layer to form the film for use as an electrode;
- said sputter depositing the hexagonal 001 oriented titanium layer and providing oxygen anneal in the lead oxide environment to convert the 001 oriented titanium into 100 oriented rutile $TiO_2$ or perovskite $PbTiO_3$,
- said sputter depositing textured lead zirconate titanate $PbZr_xTi_{1-x}O_3$ (where x ranges from 0.40 to 0.60) having an 001 orientation as the piezoelectric layer, and
- said sputter depositing the textured electrode layer on top of the textured lead zirconate titanate;

occur in the at least one chamber.

22. The method of claim 2 wherein
said coating the substrate with the amorphous coating;
said growing the crystalline textured layer on the amorphous coating;
said sputter depositing a 111 or 100 oriented textured conducting layer for use as an electrode;
said sputter depositing hexagonal 001 oriented Ti and converting it to the 100 oriented $TiO_2$ seed textured layer;
said sputter depositing the textured lead zirconate titanate having an 001 orientation; and
said sputter depositing an electrode on top of the textured lead zirconate titanate;
occur in the sealed container.

* * * * *